US010534371B2

(12) United States Patent
Amelio et al.

(10) Patent No.: US 10,534,371 B2
(45) Date of Patent: Jan. 14, 2020

(54) SYSTEM AND METHOD FOR PROVIDING AND MANAGING ELECTRICITY

(71) Applicant: 286 Two LLC, Spring Valley, NY (US)

(72) Inventors: Paul Amelio, New York, NY (US); David Katz, New York, NY (US); Alfonso Amelio, New York, NY (US)

(73) Assignee: 286 Two LLC, Spring Valley, NY (US)

( * ) Notice: Subject to any disclaimer, the term of this patent is extended or adjusted under 35 U.S.C. 154(b) by 0 days.

(21) Appl. No.: 14/693,600

(22) Filed: Apr. 22, 2015

(65) Prior Publication Data

US 2016/0313744 A1  Oct. 27, 2016

(51) Int. Cl.
| G05D 1/10 | (2006.01) |
| B64C 27/08 | (2006.01) |
| B64D 47/08 | (2006.01) |
| B64C 39/02 | (2006.01) |
| G01R 15/14 | (2006.01) |
| H04Q 9/00 | (2006.01) |
| G01R 19/25 | (2006.01) |
| G01R 22/06 | (2006.01) |

(52) U.S. Cl.
CPC ............. *G05D 1/101* (2013.01); *B64C 27/08* (2013.01); *B64C 39/024* (2013.01); *B64D 47/08* (2013.01); *G01R 15/142* (2013.01); *H04Q 9/00* (2013.01); *B64C 2201/027* (2013.01); *B64C 2201/06* (2013.01); *G01R 19/2513* (2013.01); *G01R 22/063* (2013.01); *H04Q 2209/40* (2013.01); *H04Q 2209/43* (2013.01)

(58) Field of Classification Search
CPC ...... G05D 1/101; B64C 27/08; B64C 39/024; B64D 47/08
USPC ........................................................... 701/3
See application file for complete search history.

(56) References Cited

U.S. PATENT DOCUMENTS

| 7,249,640 B2* | 7/2007 | Horchler | B62D 57/022 180/7.1 |
| 7,860,680 B2* | 12/2010 | Arms | H02J 17/00 702/127 |
| 8,103,398 B2* | 1/2012 | Duggan | G05D 1/0061 244/75.1 |

(Continued)

*Primary Examiner* — Anne M Antonucci
(74) *Attorney, Agent, or Firm* — Pearl Cohen Zedek; Latzer Baratz LLP

(57) ABSTRACT

A system and method for providing power to and monitoring the energy usage includes at least one electrical control unit having an unmanned vehicle, at least one electrical control unit, a sensor enabled to monitor a given condition; a power source; a processor configured to be in communication with the at least one sensor and said power source, said processor further configured to manage communications with said management system; an unmanned vehicle releasably coupled to said electrical control unit, said processor being adapted to release said unmanned vehicle to enable the unmanned vehicle to separate from said electrical control unit, wherein said sensor is enabled to monitor at least one of the following: voltage, current, real power, apparent power, reactive power, frequency, total harmonic distortion, arc fault, plug loads, power factor, GFI, AFI, light, temperature, humidity, methane, carbon monoxide, motion, thermal, occupancy, radio frequency, audio, video, infrared, and combinations thereof and wherein said unmanned vehicle can travel to various locations.

20 Claims, 28 Drawing Sheets

(56) References Cited

U.S. PATENT DOCUMENTS

| | | | |
|---|---|---|---|
| 2003/0234730 A1* | 12/2003 | Arms | H02J 17/00 340/870.01 |
| 2005/0133280 A1* | 6/2005 | Horchler | B62D 57/022 180/8.1 |
| 2011/0130913 A1* | 6/2011 | Duggan | G05D 1/0061 701/23 |
| 2012/0292430 A1* | 11/2012 | Ferrari | B64F 1/02 244/2 |
| 2016/0270148 A1* | 9/2016 | Filipovic | H04W 88/08 |

* cited by examiner

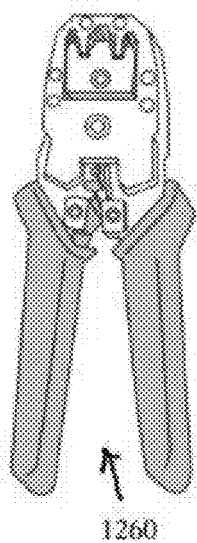
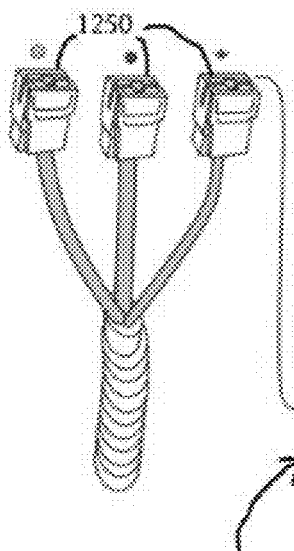
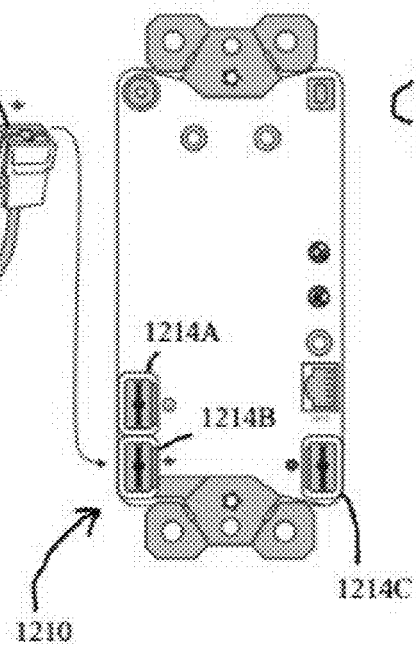

SYSTEM AND METHOD FOR PROVIDING AND MANAGING ELECTRICITY

CROSS REFERENCE TO RELATED APPLICATION

The application claims the benefit of U.S. Provisional Application No. 61/982,752, filed Apr. 22, 2014, entitled, "Miniature Unmanned Aircraft," which is incorporated by reference herein in its entirety.

FIELD OF INVENTION

The present invention is related to a system and apparatus for providing and managing electricity, which system may include as a component, an unmanned aerial vehicle.

BACKGROUND OF THE INVENTION

Electricity is an integral part of modern life. Whether in a personal home or a professional office, electricity powers appliances, tools and devices to provide a comfortable and convenient environment for people. However, as human population continues to grow, so has the demand for electricity. Concerned with how such insatiable demand and consumption impact the environment and cause sustainability issues, governments around the world have tried to raise awareness and to promote energy conservation and efficiency.

The most common approach to energy conservation is to purchase and use energy efficient tools and appliances. While it is a good attempt to promote energy efficiency, there are several drawbacks. First, this approach relies too heavily on individual purchasing decisions and usage tendencies. Even when people have the best intentions to conserve energy and purchase energy efficient light bulbs and appliances, lights are often left on after office hours and appliances are persistently plugged in and sit idle between uses. Second, in many buildings, electricity usage in common areas is a necessity but most often less than optimized. Third, currently, there is no known way to monitor energy usage both on a macro level, such as a per floor, or a section of a floor or building, and on a micro level, on a per individual outlet basis to identify inefficient points. Similarly, even when problems are identified, there is no easy way to communicate a patch to resolve the issue or to alter the usage pattern to quickly achieve the desired results.

Accordingly, it is desirable to provide an improved system and method for monitoring and managing electricity that overcomes drawbacks and inadequacies of known methods and systems.

SUMMARY OF THE INVENTIONS

Generally speaking, in accordance with the invention, a system provides a user with the ability to control devices connected to units within the system, even if the user is not physically near the devices. For example, the user may log in to the system from a cellular phone to monitor the energy usage of a specific device plugged into an electrical outlet unit, see whether or not the light is on in a certain room, or adjust the power of the ceiling fan in a specific room. The user may also be able to see reports on the energy consumption by a device, in a room, on a floor, etc.

A system in accordance with a preferred embodiment of the invention includes a plurality of units, which communicate with one or more coordinators, which relays data from the units to a server, and relays commands from the server to the units. Alternatively, the coordinators themselves may initiate and send commands to the units. Preferably, the units have safety mechanisms to prevent overheating, fires, etc., by automatically shutting itself, or the device connected to it, off.

The system preferably also includes energy saving protocols to reduce energy wasted. For example, the system may use light sensors or heat sensors to automatically adjust the light or heat/air conditioning in a specific room or area by adjusting the current being provided to the respective device.

An embodiment of the system also processes alerts from smoke detectors, motion detectors, carbon monoxide detectors, etc., to alert the user of a potential threat in the area in which such detectors are located.

An embodiment of the system receives and tracks information about each device connected to each unit, including the expected energy usage or life of the device, and alerts the user of a deviation from such expectations. Therefore, if a device fails to meet its proposed energy usage or life, the user may either alert the manufacturer or avoid using the device in the future.

An embodiment of the unit includes a plurality of circuit boards having components attached thereto, to provide power and detect energy usage of the connected device, sense the unit's internal temperature, sense or detect conditions surrounding the unit, process certain data collected by the sensors and detectors, as well as communicate with a coordinator. The unit preferably includes safety mechanisms to shut off automatically on its own, should it detect a fault.

An embodiment of the unit includes an electrical outlet, via which electrical devices can be powered. Another embodiment of the unit includes a switch, via which one may turn on, turn off, or adjust the power being consumed by a device, such as the light fixtures in a room. Yet another embodiment of the unit includes a fixture unit, via which a fixture, such as a ceiling light or fan, is connected to its power source, preferably proximate the base of such fixture.

An embodiment of the invention provides a system having a base unit and an interchangeable user interface. The user interface may be permanently or removably attached to the base unit.

Yet another embodiment of the invention is a system providing a uniform electrical outlet for countries having differing plug configurations and RFI level requirements.

In accordance with an embodiment of the invention, an electrical unit can be removably attached to an electrical housing.

Yet another embodiment includes a faceplate component that may be removable from a base unit or sandbox the faceplates and sandboxes collectively referred to as "Units," the faceplate further including securing elements that may provide a docking mechanism for an unmanned aerial vehicle or drone that removably secures the drone to the Unit(s).

Another embodiment of the invention includes a network of sandbox and faceplate units throughout floors of buildings, neighborhoods and communities to which a drone and/or drones may be deployed.

In a further embodiment the network of Units may be used to detect various environmental and electrical conditions and issue alerts when certain thresholds are exceeded or various conditions detected.

In accordance with an embodiment of the invention users of the system or stakeholders may access the network using mobile smartphones or portable tablets or desktop units either at time of their choosing or in response to alerts issued by the network for various conditions, upon which the stakeholder may access the network on his mobile, portable or other computer device and determine the nature of the condition, where in the network the condition is evident and take appropriate action to mediate the condition or notify first responders.

Still other objects and advantages of the invention will in part be obvious and will in part be apparent from the specification. Other features and advantages of this invention will become apparent in the following detailed description of exemplary embodiments of this invention with reference to the accompanying drawings.

BRIEF DESCRIPTION OF THE DRAWINGS

For a fuller understanding of the invention, reference is made to the following description taken in connection with the accompanying drawing, in which:

FIG. 25 is a rear view of a unit in accordance with an embodiment of the invention;

FIG. 26 is a side view of a connector in accordance with an embodiment of the invention;

FIG. 27 is a perspective view of a snap-in power line in accordance with an embodiment of the invention; and FIG. 28 is a perspective view of a tool in accordance with an embodiment of the invention.

FIG. 30A-1 is a perspective view of a faceplate lighting, fan docking station and drone in accordance with the present invention.

FIG. 30A-2 is a perspective view of another faceplate lighting, fan docking station and drone craft in accordance with the present invention.

FIG. 30C-1 is a perspective view of faceplate docking and drone craft in accordance with the present invention.

FIG. 30C-2 is a perspective view of a drone craft in accordance with the present invention.

FIG. 30C-3 is a perspective view of another faceplate docking and drone craft in accordance with the present invention.

DETAILED DESCRIPTION OF THE PREFERRED EMBODIMENTS

Figure 1:
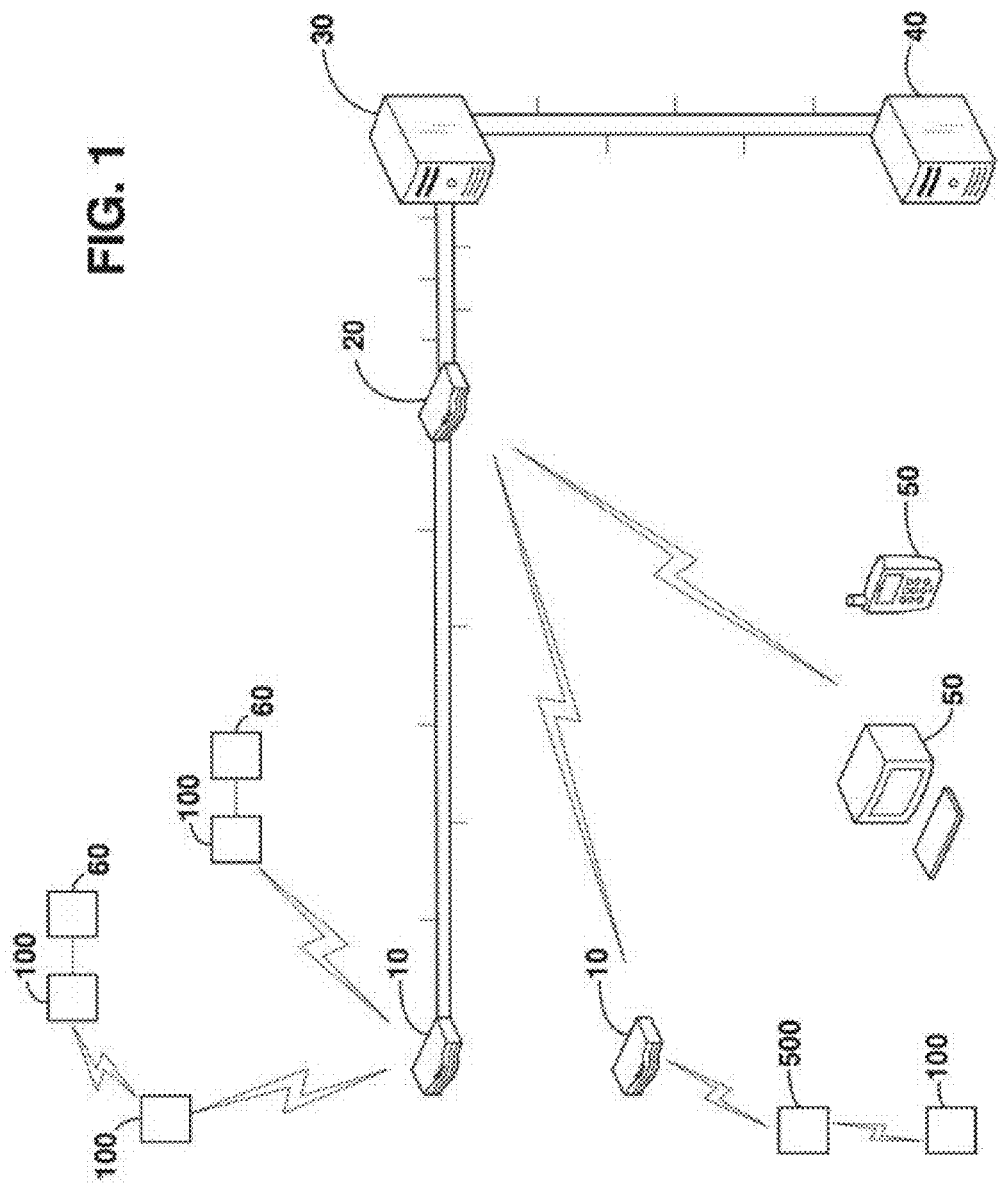
FIG. 1 is a diagram showing a system in accordance with an embodiment of the invention.
Figure 2:
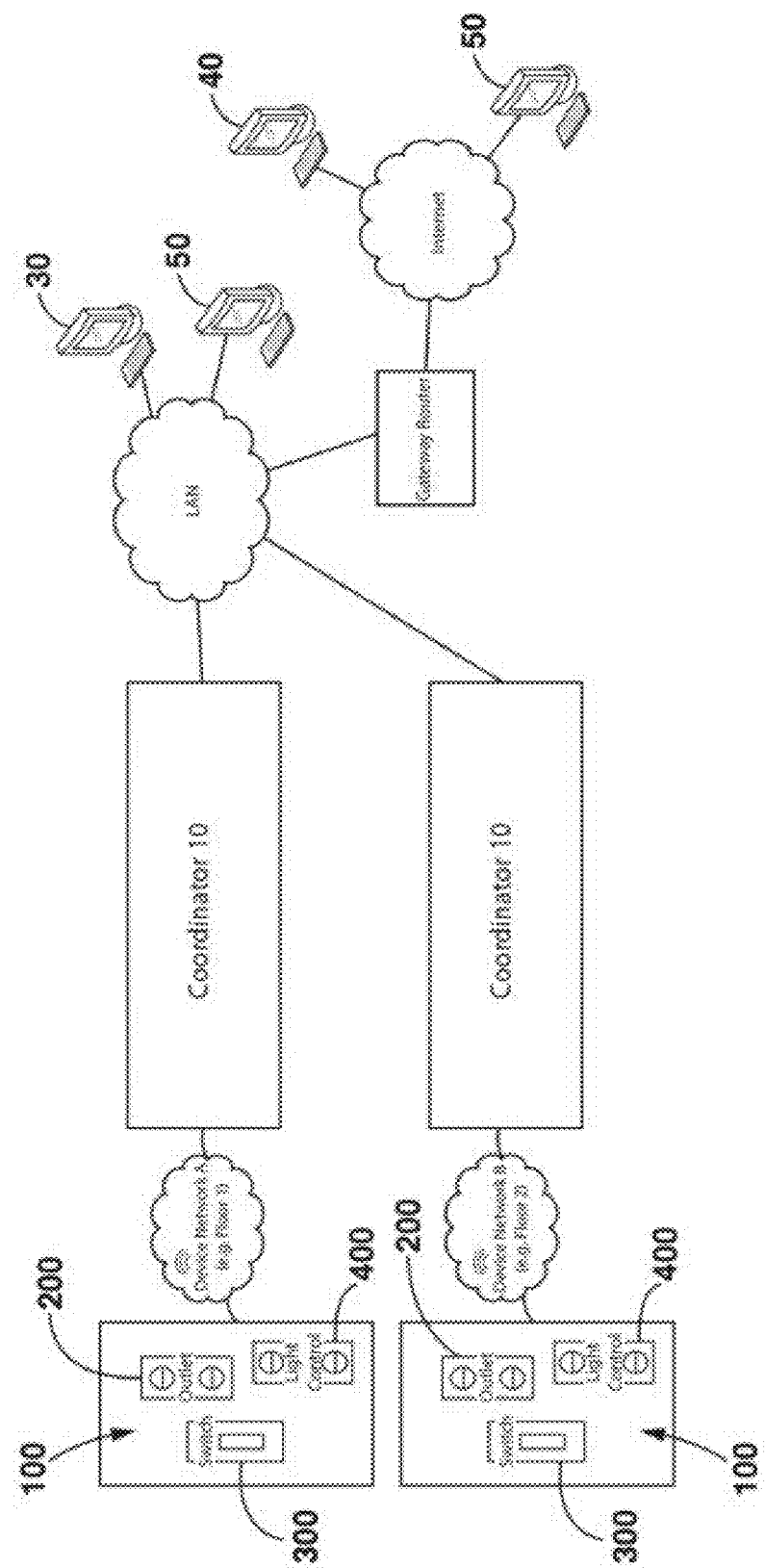
FIG. 2 is a diagram showing a system in accordance with an embodiment of the invention.

System Overview. Certain exemplary embodiments of the present invention will now be described with reference to the drawings. Reference is made to FIGS. 1-2, in which a system in accordance with certain embodiments of the invention is shown having a plurality of units 100, a plurality of coordinators 10, a router 20, a local server 30, a remote server 40 and a plurality of communication devices 50.

The units 100 preferably interface with the energy consuming devices 60 in a facility. For example, the units 100 may be connected to lamps, light fixtures, appliances, televisions, fans, or a variety of other electrical units in a room, a house, or a floor of a building, by way of non-liming example. In accordance with an exemplary embodiment, the units 100 can replace existing outlets and switches or be installed in light fixtures or fan controls, preferably designed and constructed to fit into a standard electrical box, thereby facilitating retrofitting of facilities.

The units 100 preferably provide a variety of functions, for example, monitoring the energy usage of any device electrically connected thereto, turning the device 60 on and off, dimming it where appropriate, or otherwise monitoring or controlling the device. Each unit 100 monitors the amount of energy being drawn by the device 60 electronically connected to it. For example, if the device 60 is a lamp having two light bulbs and the energy usage at the unit 100 suddenly drops to half of what it was previously, it may indicate that one of the light bulbs blew out and needs to be replaced. An energy usage greater than expected for a specific appliance may indicate a flaw in the appliance.

Generally, the units 100 may send data collected about the device 60 to one or more coordinators 10. For example, the unit 100 may send data regarding the device's energy consumption to the coordinator 10 regularly, or if the device 60 is suddenly drawing a significantly greater or lower amount of energy, the unit 100 may send such data to the coordinator 10 regardless of its scheduled protocol.

The coordinator 10 preferably processes most, more preferably all, the commands. Therefore, the commands can be processed and responded to more quickly than if one of the servers 30, 40 processed them. In certain scenarios, the coordinator 10 may receive data from the unit 100 and send a command in response thereto itself.

In accordance with an embodiment of the invention, the coordinator 10 possesses the valid local network configuration and security controls. Therefore, the coordinator 10 may control local security to help assure the authenticity of devices attempting to join the network. In accordance with a preferred embodiment of the invention, each transceiver 132b of units 100 is assigned a unique media access control (MAC)address, preferably during hardware fabrication, and required to "join" the network. Joining is a secure process in which an authorized device is allowed to become a member of a Personal Area Network (PAN). The PAN ID is assigned by the coordinator 10, which keeps track of which units 100 are allowed on the network through their MAC addresses. The signals from the network are received and decoded by the transceiver 132b of the unit 100. Therefore, once a unit 100 is validated on the network, the free exchange of commands and data can commence. Also, assigning each transceiver 132b a unique address may facilitate identifying the units 100 when communicating therewith, for example, receiving data from or sending commands thereto.

A system may have one or more coordinators 10 communicating with the local server 30 directly. Alternatively, in a network of coordinators 10 with a central coordinator, the coordinators 10 communicate with the central coordinator, which then communicates with the local server 30. In a preferred embodiment, each coordinator 10 manages up to 100 units 100. The ratio of units 100 to coordinator 10 may be varied according to various factors, such as the volume and frequency of reports and response time desired, the layout of the facility, the type of equipment being connected to the units, etc. In accordance with an embodiment of the invention, a building may have one coordinator 10 per floor, to manage all the units 100 on the corresponding floor. The coordinators 10 either communicate with the local server 30 directly or via one or more other coordinators 10, using such other coordinators 10 as signal repeaters.

The units 100 of the system may also be include signal repeater units 500, acting as a bridge between the units 100 and the coordinator 10 to facilitate the transfer of data, commands, etc. therebetween. The repeater units may be used when the units 100 are located far from each other or from any coordinator. The repeater units 500 may be additional units 100 or modified units 100 without defined control functions or modified units 100 having transceiver 132b but having the control functions removed.

According to one embodiment of the invention, units 100 and coordinators 10 are connected wirelessly, creating a wireless network. The wireless network connecting the units 100 and coordinators 10 is preferably a mesh network, wherein each unit 100 functions as a signal repeater and the coordinator 10 is the controller for all the units 100 in its network. Such a network may reduce the number of coordinators 10 or signal repeater units 500 necessary to facilitate data transmission between the units 100 and coordinators 10. An example of a wireless network suitable for an embodiment of the invention is a ZigBee® based wireless protocol. Once it received information, the coordinator 10 then relays the data wirelessly to the local server 30 via router 20. Whereas a wireless communication network is illustrated, it is to be understood that the coordinator 10 may be connected to the units 100, router 20 and/or the local server 30 via a wired connection, such as an Ethernet connection.

Information and data collected by units 100 are passed to the local server 30. The local server 30 is running an operating system, preferably Windows® or Linux®, upon which the control and user application platforms run, and capable of running a web service to interact with the remote server 40 and other communication devices. In accordance with an exemplary embodiment, the control applications include a console based graphical user interface granting the users access to various levels of the system based on authorization. For example, a building administrator can specify and control lighting conditions for the entire building while individuals have access only to control functions in their office or immediate work area.

In one embodiment, the local server 30 forwards the data or report received from Unit 100, or a report or alert created by local server 30 in response to the received data, to a user of the system via one or more communication devices 50. The user can then decide on a course of action. For example, the user may notice that a device 60 was unintentionally left on or plugged in and want to turn it off or reduce power being provided to it. The user can send the desired command to the local server 30, which in turn relays the command to the unit 100 to which the device 60 is electrically connected, via router 20 and coordinator 10. If the user wishes to turn the device 60 off, the unit 100 would stop the current flowing into the device. If the user wishes to reduce the amount of power being provided to the device 60, the unit 100 would reduce the current flowing into that device 60.

As described above, the data may be relayed wirelessly, via a wireless local area network, such as WiFi, ZigBee® based wireless protocol or via an Ethernet cable or other wired connection, or a combination thereof. Whereas the embodiments of the system described herein refer to a wireless network, it is to be understood that a wired connection or other networking system in contemplated within the scope of the invention. It is also understood that compatibility with wireless controlled appliances, whose industry standards protocol are under development, is contemplated within the scope of the invention. For example, the coordinator 10 or unit 100 may send the command directly to the device 60 so turn itself on or off.

It is to be understood that the user need not reply to an alert or report from the system in order to take action. Rather, the user may use the communication device 50, such as a smart phone, computer, tablet, or any other device via which the user can communicate with the local server 30 or remote server 40, to send commands at any time. Whereas the system preferably promotes efficiency in energy consumption, there are numerous conveniences that it provides as well. For example, if the user forgot to turn off the stove, rather than rushing home, the user may check and send a command to turn off the unit 100 connected to the stove. The user may monitor whether or not the children are watching television or using the computer, etc. past their bedtime and shut them down remotely. If the sprinklers are scheduled to go off at a certain time but it is raining, the user may use the communication device 50 to command the unit 100 to turn off the sprinkler. If the user wants to cool his house before he gets home on a hot day, he may turn on the air conditioning unit or fan at the desired setting by adjusting the amount of power being provided to it. Whereas there may be systems currently available to perform some of these tasks remotely, the embodiment of the invention provides a system for controlling most, if not all, devices, so long as the devices are connected electrically or by a wired or wireless communication connection.

The system may have a variety of settings requiring certain actions be taken when a condition is met. In an example of such a setting, if a unit 100 detects a device having a power factor of less than 90%, the unit 100 alerts the coordinator 10, which then relays the data to the local server 30, which notifies the user via a communication device 50. The user may request the unit 100 to turn the device off or leave it as is. The same system setting could provide that if the unit 100 detects a device having a power factor of less than 75%, the unit 100 must turn the device off immediately, without waiting for instructions from the user. Another example of a system setting includes having a default time for dimming, for example, 30 seconds. Various other settings may be provided, such as energy savings modes, unit failure modes, and default action in case of network failure. For example, a unit 100 connected to a lamp or light fixture may be programmed to turn the lights on when the network fails and the unit 100 is unable to communicate with the coordinator 10 for over 60 seconds.

Preferably, some units 100 have safety devices such that ground and arc faults as well as overheating can be detected and dealt with, preferably at the unit level without user input or commands from the coordinator 10 or local server 30 or remote server 40. For example, a unit 100 may include sensors to detect such conditions and alert the coordinator 10. The coordinator 10 is preferably designed and programmed to process the information, and if determined appropriate, command the unit 100 to shut down immediately. This may be preferred to speed up response time by eliminating the need to communicate with the server and/or user to determine what action to take, and a difference of seconds may be critical to whether or not a fire starts. Alternatively, unit 100 may have a mechanism to shut itself down automatically upon such fault or overheating, without waiting for a command from the coordinator 10.

In addition to or as an alternative to the local server 30, a remote server 40 may be included in the system. In accordance with a preferred embodiment, the local server 30 analyzes the data received from unit 100 and generates reports, such as usage analysis reports. It then sends the data received, analyses and/or reports generated with respect to that unit 100 (collectively "unit data") to the remote server 40. The remote server 40 may be a cloud server connected via the Internet, which saves the unit data for access via the Internet or other means as a matter of application specific design choice. The remote server 40 may also analyze and process reports, such as periodic reports and energy savings information.

Once the unit data is sent, the local server 30 would then be free to delete the unit data locally on a regular basis, which may speed up response time and reduce the storage necessary for the local server 30. However, it is to be understood that the system may include only one server, either local or remote, multiple local servers, multiple remote servers, or any alternate structure as desired, without deviating from the scope of the invention. For example, if a system has a local server 30 without a remote server 40, all system commands and data functions would be available at the local server 30, therefore the system could be contained within the boundaries of its firewall. Thus, the level of response and security may be improved. Additionally, the system would remain fully functional, including the reports and data being backed up and saved, even if there is no Internet connection. However, a large storage would likely be required, depending on the size of the system, which may be burdensome for smaller facilities. Some facilities may prefer a system having a remote server 40 without a local server 30, although such a configuration may delay response time. Accordingly, the number of local servers 30 and/or remote servers 40 may be varied as desired.

Units. Units 100 generally include one or more boards 102. Units 100 may optionally include a front panel 120, and a faceplate 170. Preferably, unit 100 is constructed and designed to fit inside a single gang electrical box, for example, in a housing having a dimension of 3 inch by 2 inch by 2.5 inch. When a front panel 120 and the faceplate 170 are included in the unit 100, the front panel 120 is preferably positioned partially outside of the electrical box to match the depth created by surrounding wall material, such as sheetrock, and the faceplate 170 covers the wall opening for the electrical box.

Boards. Preferably, the boards 102 are circuit boards, such as a printed circuit board (PCB), a breadboard, a strip board or other structure suitable for electrically connecting components (collectively referred to herein as "circuit board"). Boards 102 may include a first board 130 and a second board 140. Whereas the embodiments illustrated show two boards 130, 140, it is to be understood that the unit 100, can have one board or more than two boards without deviating from the scope of the invention, as a matter of application specific design choice.

The first board 130 and the second board 140 are preferably joined physically by a coupling mechanism, for example, one or more inserts or threaded standoffs. It is to be understood that the coupling mechanisms between the front panel 120 and the boards 102 or faceplate 170 may be the same or it may differ, without deviating from the scope of the invention.

The first board 130 and the second board 140 generally include electrical connectors 105 and 106, which electrically connect first board 130 to the second board 140. These electrical connectors are preferably eight-pin headers and are located on each end of the boards 102.

First board. Generally, the first board 130 also includes circuitry to carry out functions of the unit 100. For example, the first board may include a plurality of components including a Micro Controller Unit (MCU) 132*a* and an RF transceiver 132*b* that receives and decodes commands. In addition, the first board 130 may also include other components such as a GFI controller 132c, AFI controller 132d, program flash 132e, antenna 132f and an energy monitoring device 132g. These first components may be integrated or provided externally as matter of application specific design choice. For example, antenna 132f may be integrated unto the first board 130 or provided externally.

Figure 3:
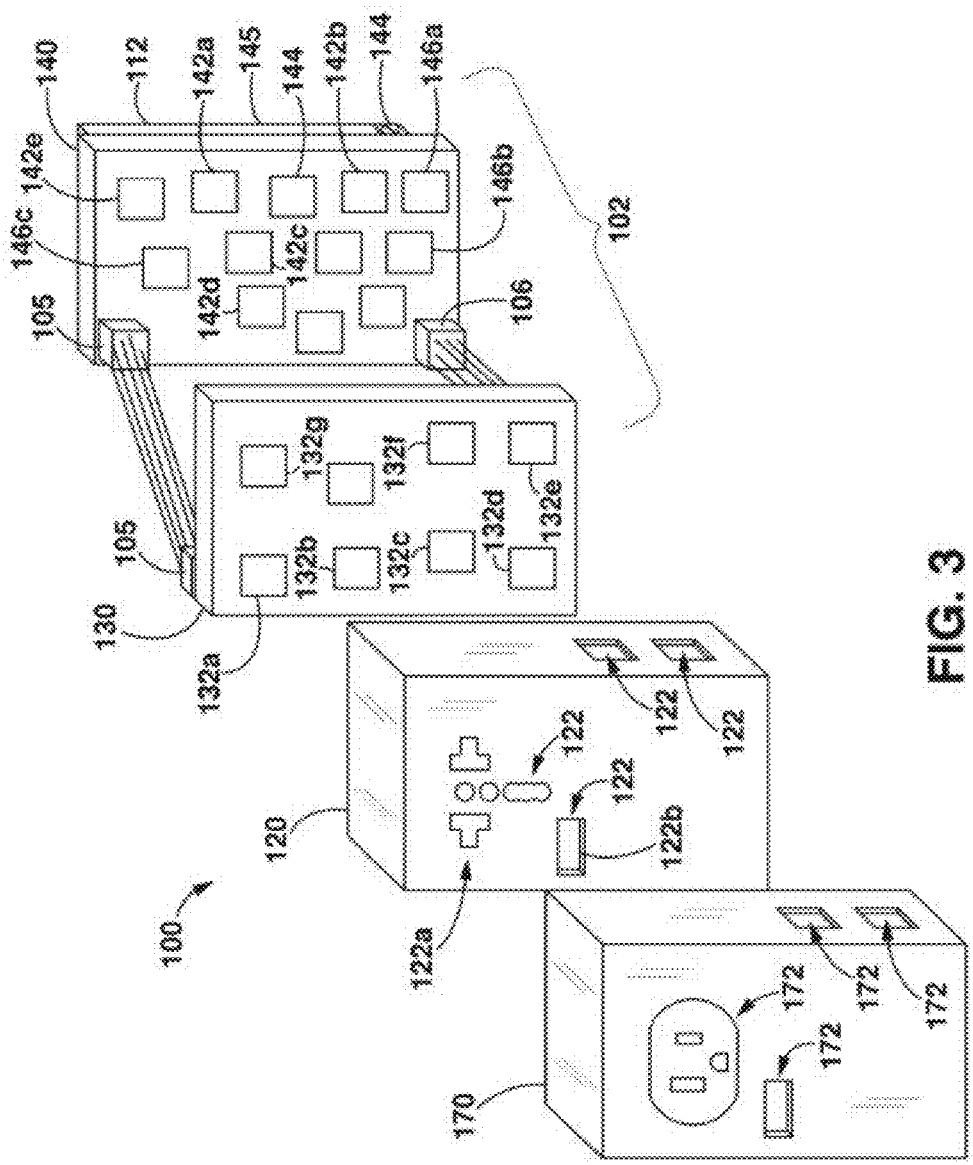
FIG. 3 is an exploded perspective view of a unit in accordance with an embodiment of the invention.

The MCU 132a processes most or all the control commands, and performs a plurality of functions. The MCU 132a and the transceiver 132b may be separate, as shown in FIG. 3, or integrated into a single circuit. If the MCU 132a and transceiver 132b are separate components, the communications therebetween preferably occur on a Serial Peripheral Interface Bus (SPI).

In addition, MCU 132a is preferably capable of over-the-air programming by receiving such programming or system updates from the coordinator 10. The MCU132a may also store configuration parameters and current states for recovery via a program flash. In one embodiment, an energy monitoring device 132g is also included, which is preferably a special purpose integrated circuit, that measures and records voltage and current flows and calculates the active and apparent energy usage over a period a time. The energy monitoring device 132g may communicate with the MCU132a through the SPI.

In addition to energy information, the MCU132a may also receive and process temperature information and monitor the temperature information for compliance under the conditions. If conditions are not in compliance, the MCU 132a may send a command to deactivate. The current flow and temperature may also be monitored and limited by the MCU 132a. The MCU 132a also may generate status indicators for digital or other display as appropriate.

The RF transceiver 132b receives and decodes commands for the MCU 132a and allows the MCU 132a to communicate with the rest of the system, for example, with coordinator 10. An additional role of the transceiver 132b may be to inform the MCU 132b upon a prolonged loss of communications with the coordinator 10. The MCU 132a may then take appropriate action to indicate and address this state.

The first board 130 may include a visible status indicator, for example, an LED indicator, visible through or outside of the faceplate 170. The LED indicator may have a plurality of colors or states each indicating a different status of the unit 100. For example, if the LED is off, it may indicate that the unit 100 is offline. A red LED may indicate a fault, and a flashing red LED may indicate an imminent fault. A green LED may indicate that the unit 100 is online and working properly, and a flashing green LED may indicate that the unit 100 is attempting to join or rejoin the network.

Various environmental sensors, such as a light sensor, a room temperature sensor, a motion sensor and a carbon monoxide sensor, etc. may optionally be integrated on the first board 130. Depending on their functions, these sensors may or may not have corresponding apertures on the faceplate 170.

Second board. The second board 140 preferably includes screw terminals 144, a power supply 145, and a plurality of components comprising various power sensing and controlling mechanisms. By way of non-limiting example, the plurality of second components may include voltage suppression/power converter device 142a, current sense coils 142b, control relay 142c, Triode for Alternating Current (triac) dimming control drivers 142d, and thermal sensor 146c.

The second board 140 preferably includes a control relay 142c, which is a normally open double pole double throw mechanical relay designed to disconnect the load from the mains. The control relay 142c may respond to the normal on/off commands sent over the network or the fault signals from the MCU 132a, which generate a signal to activate or deactivate the relay driver circuitry. It is to be understood that a solid state version of the relay is contemplated within the scope of the invention.

The second board 140 may also include a triac circuitry comprising and a dimming control driver 142d and a dimming control triac 142e. The dimming control driver 142d is preferably an integrated circuit to amplify and translate the control signal out of the MCU 132a to drive the triac dimmer control 114. The dimming control triac 114 is preferably a semiconductor device capable of the controlled conduction of current in two directions, and therefore triacs may be preferred for use in alternating current dimming applications. A triac is controlled by a voltage pulse presented to the gate terminal of the device called a trigger. If this trigger pulse is synchronized with the start of the alternating current cycle, the device can be made to conduct on all or a portion of the cycle. By delaying the timing of the trigger pulse the duty cycle of the voltage and current waveforms are limited at the load, producing the dimming effect.

The timing and duration of the gate pulse is preferably generated by the MCU 132a. The MCU 132a may receive a sync pulse generated on each zero crossing of the alternating current sine wave. This pulse starts an internal timer, which in turn generates the trigger at the time in the cycle required to produce the level of dimming specified. Shorter timing allows the dimming control triac 114 to conduct for longer in the cycle and therefore produce less dimming. Increasing the trigger delay time produces a larger dimming effect.

The second board 140 preferably includes a heat sink 112. The heat sink 112 is preferably able to fully dissipate the maximum power in the dimming control triac 114 in the environment while maintaining a case temperature of less than 100° C. By way of non-limiting example, if the maximum power in the unit 100 is 23 watts for the dimming control triac 114, the thermal resistance for the heat sink 112 is preferably less than 2.1° C./Watt. The heat sink 112 may be mounted on the back of the second board 140 away from the first board 130, or it may be a separate piece from the second board 140.

Generally, electricity enters the unit 100 from the power supply 145 through screw terminals 144 on the second board 140. Upon entering, power is conditioned by a voltage suppression/power converter device 142a. The voltage suppression/power converter device 142a is designed to reduce the amount of Radio Frequency Interference (RFI) which is reflected back on the mains. Devices with internal dimming circuits can generate large amounts of interference, and many countries require control on the magnitude of RFI generated by a dimming device. Therefore, it is preferred to reduce the RFI level, more preferably to meet or exceed the European Union (EU) requirements for Electrical Lighting and Similar apparatus—EN55015.

The voltage suppression/power converter device 142a may be a metal oxide varistor (MOV). The literature shows 80% of all line transients have a duration between 1 and 10 µs and amplitudes up to 1.2 kV, which occur more than 10 times per day. Therefore the MOV device preferably has a voltage and energy rating capable of absorbing these transient without significant degradation over time. The MOV is preferably rated for a continuous 300 Volts AC with a clamping voltage of about 400 volts. Preferably, the energy rating is at least 50 to 75 joules.

In one embodiment, the voltage suppression/power converter device 142a also includes a switching regulator, which converts the high AC voltage of the mains to a lower DC supply voltage to power. Preferably, the switching regulator is capable of generating 5 volts and 3.3 volts.

The total current required from the low voltage switching regulator may be about 800 ma, with an output current of 1 ampere. Given the current requirements of the power converter switching regulator, there are several other factors to consider before choosing a circuit configuration. First, the regulator preferably interfaces directly from the mains, eliminating the need for a bulky transformer, which takes up space and may require personalization for different voltage configurations. Second, the output of regulator is preferably non-isolated, thus obviating the need for an internal isolation transformer and its associated cost and area. Third, given the high currents required, the regulator device is preferably mounted on a heat sink 112 to dissipate the power. Some or all of these factors may come into play in determining the final output specifications of the switching regulator. The voltage suppression/power converter device 142a can also includes low-dropout (LDO) regulator to convert the +5 volts to +3.3 volts for the MCU and wireless network radio components.

The current invention may also include several safety features integrated into the unit 100. In one embodiment, several safety-related detectors are integrated into unit 100. For example, the second board 140 may optionally include an internal thermal sensor 146c, which preferably detects overload. In addition, two current sensing coils 142b monitoring currents may be included on the second board 140 to send signals to a Ground Fault Interrupter (GFI) controller 132c and Arc Fault Interrupter (AFI) controller 132d on the first board 130. Generally, a GFI circuitry may protect people from electrical shock from a fault appliance or an accidental insertion of an object into the outlet. An AFI circuitry may detect abnormal circuit conditions such as spikes and operating current.

Generally, the GFI controller 132c on the first board 130 utilizes two sensing coils 142b on the second board 140 to monitor the current flow in the high line and the neutral line of the main. These signals are amplified in an integrated circuit, which sends out a fault signal when the differential current exceeds 4 to 5 ma. As the GFI controller 132c monitors the amount of current flowing from hot to neutral, preferably it is able to sense a mismatch as small as 4 or 5 milliamps, and can react in milliseconds, thus removing the hazardous condition before harm can occur. If there is any imbalance, a signal is sent from the GFI controller 132c to the MCU 132a, which then trips a control relay 142c and removes drive to the circuitry.

The AFI controller 132d also utilizes the signals from the sensing coils 142b, and detects abnormal circuit conditions such as spikes in operating current. These spikes can be caused by loose connection or damaged wire. These conditions not only waste energy, but they could eventually cause overheating and a fire. By monitoring the current flow and analyzing changes in conditions, the AFI controller 132d can also cause to trip the control relay 142c via MCU 132a to alleviate the hazard in case where abnormal conditions are recurring.

The second board 140 may also include a thermal sensor 146c, for example a temperature sensor circuit. The thermal sensor 146c may be attached to the heat sink 112. Through the thermal sensor 146c, the MCU 132a can monitor internal temperature and signals a fault if the maximum operating temperature, for example, 90° C., is exceeded. This condition will deactivate the control relay 142c as a safety measure and send an alert to the system. The MCU 132a also monitors the expected temperature based on the current operating conditions and signal an alert if it is excessive.

Faceplate. Unit 100 may also includes a faceplate 170, which may make unit 100 aesthetically pleasing, while providing a cover to protect the other components of the unit 100. The faceplate may be designed and constructed in different materials according to the desired use. For example, in one embodiment, the faceplate 170 may be made from plastic material as used for conventional sockets. Faceplate 170 may have receiving portions 172 comprising apertures, which may or may not correspond to receiving portions on the front panel 120. The arrangement of these apertures depends on the location's electric system to receive different types of electric plugs with different pin arrangements.

Front panel. The front panel 120 is preferably the interface by which the device 60 is electrically connected to the unit 100, and is positioned between the faceplate 170 and the first board 130 outside of the electric box. Alternatively, the unit 100 may include a front panel 120 without a faceplate 170. The faceplate 170 and front panel 120 may be separate pieces or be integrated into a single piece. In addition, the front panel 120 and the first board 130 may be joined physically by a coupling mechanism, for example, by one or more inserts or threaded standoffs. The front panel 120 and the first board 130 are preferably electrically connected by electrical wires. It is to be understood that the coupling mechanisms between the faceplate 170 and front panel 120 and between front panel 120 and first board 130 may be the same or may differ, without deviating from the scope of the invention. Additionally, the front panel 120 may be constructed and arranged to fit partially or wholly within the electrical box 600, as shown in FIGS. 4-8.

The front panel 120 may comprise one or more receiving portions 122. Depending on specific application and design, the configuration of receiving portions 122 correspond to and align with receiving portions 172 on the faceplate 170 where applicable. The receiving portions 122 serve to receive cables, plugs, cords or other means by which power can be provided to a device attached thereto, such that the device can be electrically connected to the unit 100. By way of non-limiting example, the receiving portions 122 can be constructed and configured to connect to various devices or apparatuses. For example, receiving portions 122 may be a power plug outlets, Universal Serial Bus (USB) ports, mini-USB ports, micro-USB ports, HDMI ports, Ethernet jacks, and telephone jacks. It is to be understood that the receiving portions 122 may include any port or jack constructed and arranged to receive a desired cord, device, etc. as a matter of application specific to design choice and is not limited to the examples provided herein. Alternatively, one or more of such ports or jacks may be integrated into faceplate 170 or one of the boards 102 as a matter of application specific design choice. Preferably, such ports or jacks are isolated from the mains to avoid the mixing of high and low voltage wiring within the same box. Whereas the examples of receiving portions 122 given generally define apertures or cavities into which a cord, device, etc. may be inserted, it is to be understood that receiving portions may transfer energy via conduction without requiring a device, cord, etc. to be physically inserted into the receiving portion 122. For example, a device may be powered by contacting a surface of the receiving portion 122 or simply by being within a maximum distance thereto for energy to be transferred to the device.

The front panel 120 or first plate 130 may also include various environmental sensors, such as a light sensor, a room temperature sensor, a motion sensor and a carbon monoxide sensor. Depending on their functions, these sensors may or may not have corresponding apertures on the faceplate 170 and/or front panel 120. The light sensor may sense ambient light and facilitate the system making adjustments to optimize energy consumption while maintaining a certain level of illumination. For example, when there is a lot of sunlight coming into the room, the system may dim the lights connected to units 100 to achieve a certain level of illumination. As the day progresses and sunlight increases or decreases, the brightness of the lights may be adjusted accordingly to maintain the desired level of illumination. Such a system may maximize the use of natural light and eliminate energy being wasted on wasted light.

The light sensor preferably can detect a luminance change range of 100 times, for example, from 0.02 mw/cm$^2$ to 2 mw/cm$^2$. The room temperature sensor preferably detects and reports the temperature of the room or space in which the switch is located. Preferably, the effective temperature range is between 0 to 100 degrees Fahrenheit. The room temperature sensor may also be used to interface and control HVAC (heating, ventilation and air conditioning) systems. The motion sensor preferably detects and reports the times and days of movements detected. Accordingly, the system may develop custom profiles for the location, which may facilitate anticipating customs and practices. The motion sensor preferably has a detection distance of about 10 m or more, and a detection angle of greater than about 100 degrees vertically and horizontally. The carbon monoxide sensor preferably can detect from 1 ppm to 10,000 ppm and includes an internal alarm for immediate alert, and notifies the coordinator and preferably links to safety and security agents. Preferably, the carbon monoxide sensor has a response time of less than 60 seconds. Any of the sensors may or may not be built into unit 100. Alternatively, one of more of these sensors may be connected to unit 100 through one or more of the receiving portions 122.

Figure 4:
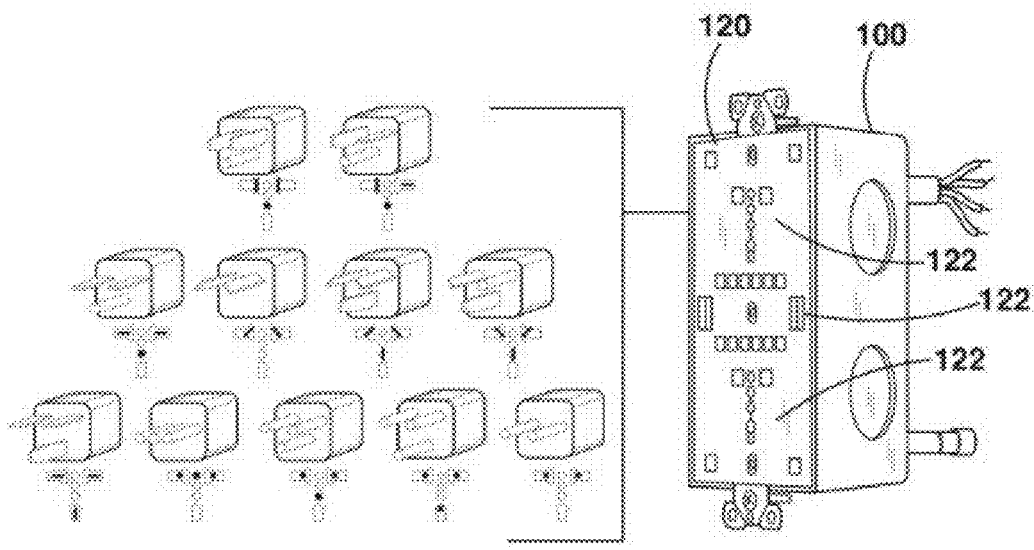
FIG. 4 is a perspective view of a unit and plugs in accordance with an embodiment of the invention.

The front panel 120 may also include a visible status indicator, for example, an LED indicator, visible through or outside of the faceplate 170. The LED indicator may have a plurality of colors or states each indicating a different status of the unit 100. For example, if the LED is off, it may indicate that the unit 100 is offline. A red LED may indicate a fault, and a flashing red LED may indicate an imminent fault. A green LED may indicate that the unit 100 is online and working properly, and a flashing green LED may indicate that the unit 100 is attempting to join or rejoin the network. Preferably, the same boards 102 and other associated components may be used in various countries with mains of different electric voltages. More preferably, the same front panel 120 is used in the different countries as well, by providing receiving portions 122 capable of receiving plugs of the various countries, as described in further detail below and illustrated in FIGS. 3-6. Accordingly only the faceplate 170 would need to be country-specific to receive the standard electric plug of the country as needed. As shown in FIG. 4, the unit 100 may be used without a faceplate 170.

Furthermore, in accordance with an embodiment of the invention, the boards 102 may be used with various front panels 130 having the contacts, interface, components, etc. to provide the desired function, thus providing a system of interchangeable front panels 130. In such a system, the same boards 102 may be installed in the electrical outlets of a building as well as in place of light switches and at the base of fixtures such as ceiling fans. Then, according to the desired use of the specified unit 100, the appropriate front panel 120 may be connected thereto. For example, a front panel having a power outlet interface may be provided by the bed for plugging in an alarm clock, a lamp, etc. Alternatively, a front panel having a switch interface may be provided in lieu of the power outlet interface, if the user wishes to have the switch located there instead of an outlet.

In a toddler's room, it may be preferred to place a front panel having a power outlet interface higher above the ground to prevent the toddler from touching it. The electrical boxes proximate the floor of the toddler's room may have front panels 120 without any receiving portions 122 to help prevent the toddler from getting an electrical shock. Instead, the front panels 120 may have cameras to monitor the toddler. It is to be understood that any and all the front panels 120 may have cameras if desired, as a matter of application specific design choice. Preferably, the removal and attachment of the front panel 120 is simple enough for the user to rearrange the front panels 120 as desired, without requiring a new installation thereof.

Figure 5:
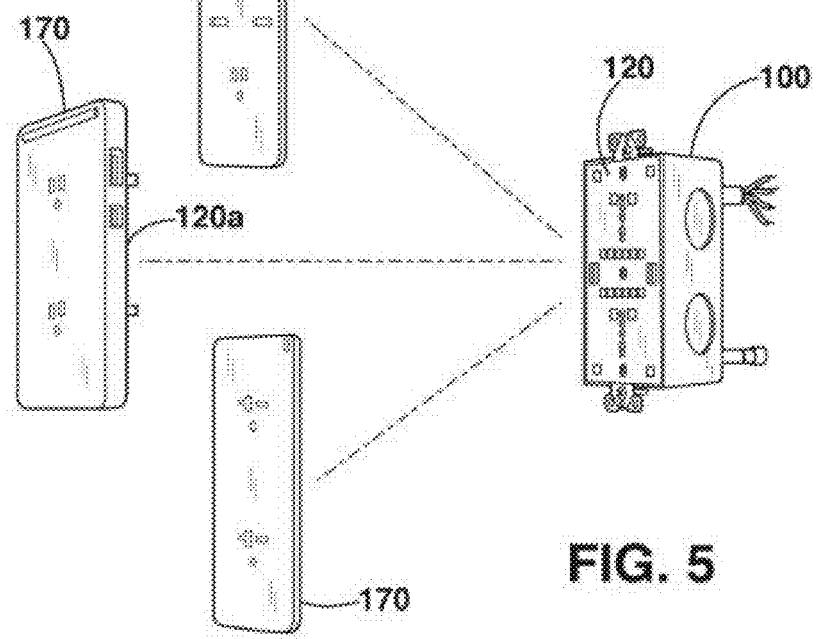
FIG. 5 is a perspective view of a unit and a variety of faceplates in accordance with an embodiment of the invention.
Figure 6:
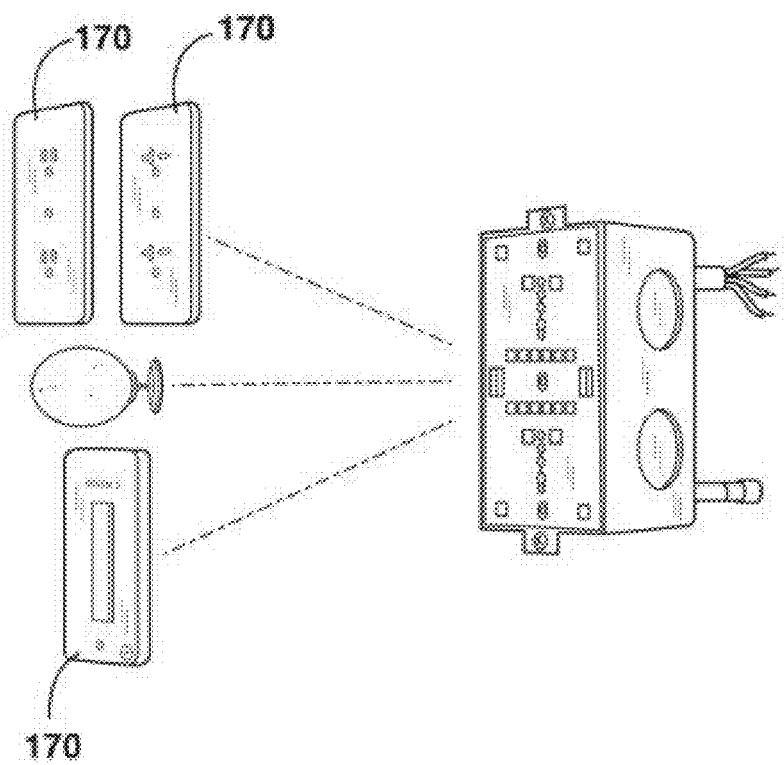
FIG. 6 is a perspective view of an interchangeable system in accordance with an embodiment of the invention.
Figure 7:
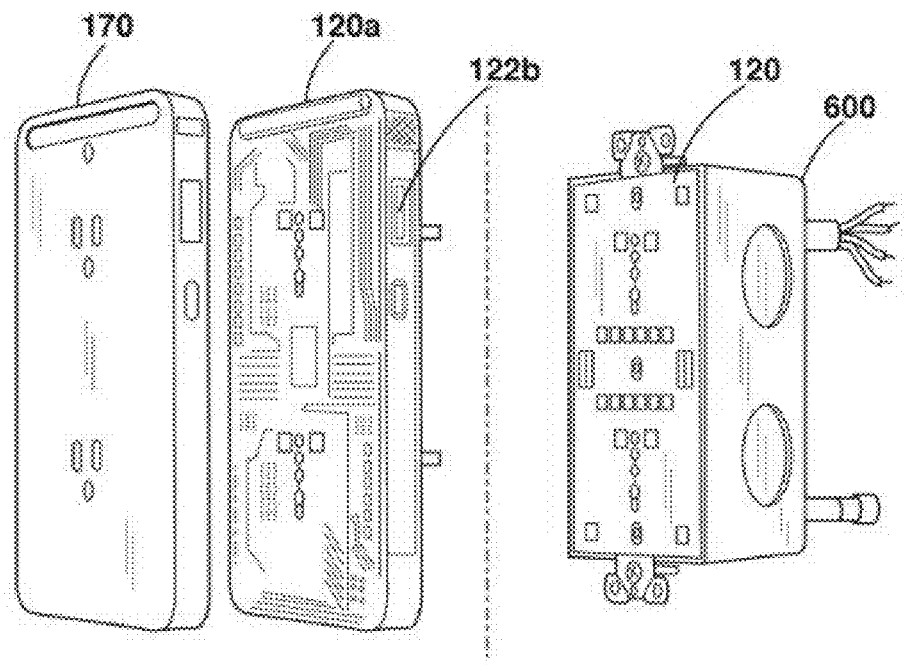
FIG. 7 is a partially exploded perspective view of a unit in accordance with an embodiment of the invention.
Figure 8:
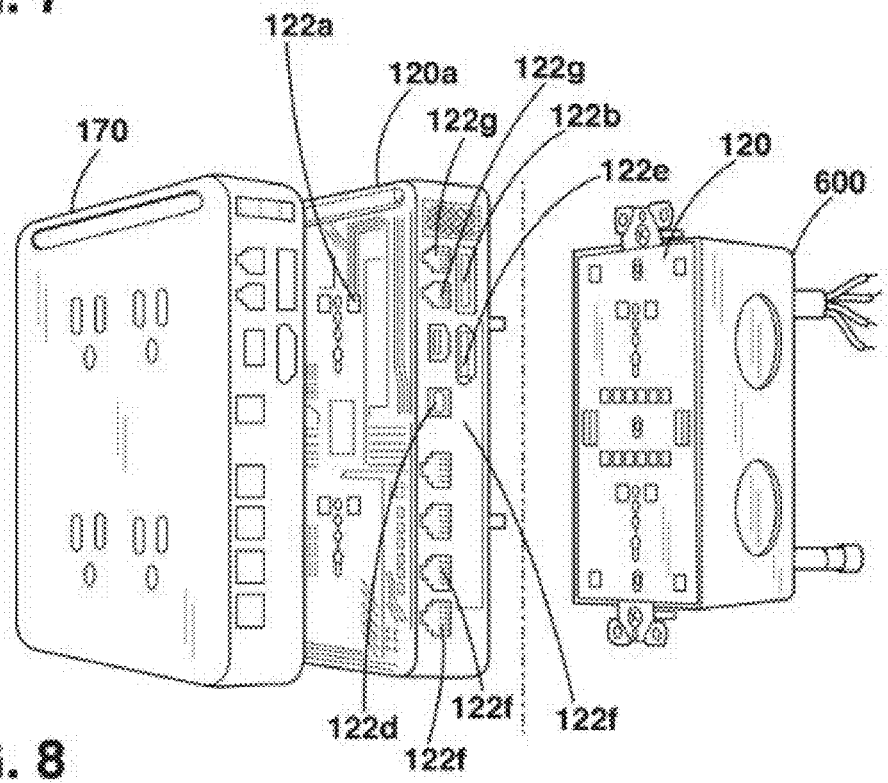
FIG. 8 is a partially exploded perspective view of a unit in accordance with an embodiment of the invention.

Alternatively, an embodiment of the invention as shown in FIGS. 5-6 provides a system in which the boards 102 and front panel 120 are suitable for various uses, just by replacing the faceplate 170 to a faceplate 170 for the specified use. A unit 100 may also include more than one front panels 120, as shown in FIGS. 5, 7-8. In the embodiments shown, a second front panel 120a connects to the front panel 120 outside of the electrical box 600. Such an arrangement may be preferred in embodiments where the front panel 120 fits within the electrical box 600. The second front panel 120a as shown provides room for additional receiving portions, such as plug-receiving portions 122a, Universal Serial Bus (USB) ports 122b, mini-USB ports 122c, HDMI ports 122e, Ethernet jacks 122f, and telephone jacks 122g. In the embodiment shown, the second front panel 120a also includes a speaker 124 through which a user may speak to someone in the room in which the unit 100 is located.

Figure 9:
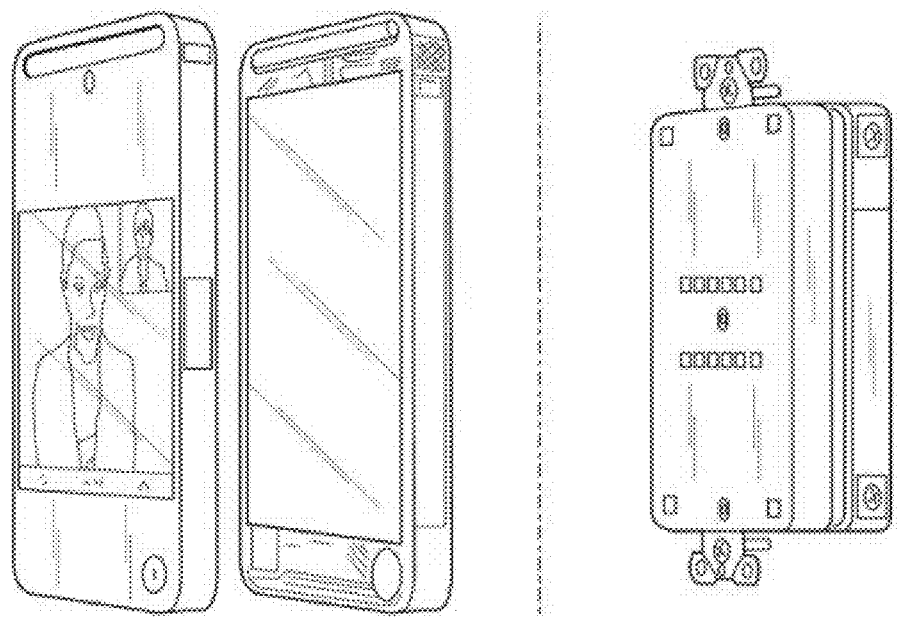
FIG. 9 is a partially exploded perspective view of a unit in accordance with an embodiment of the invention.
Figure 10:
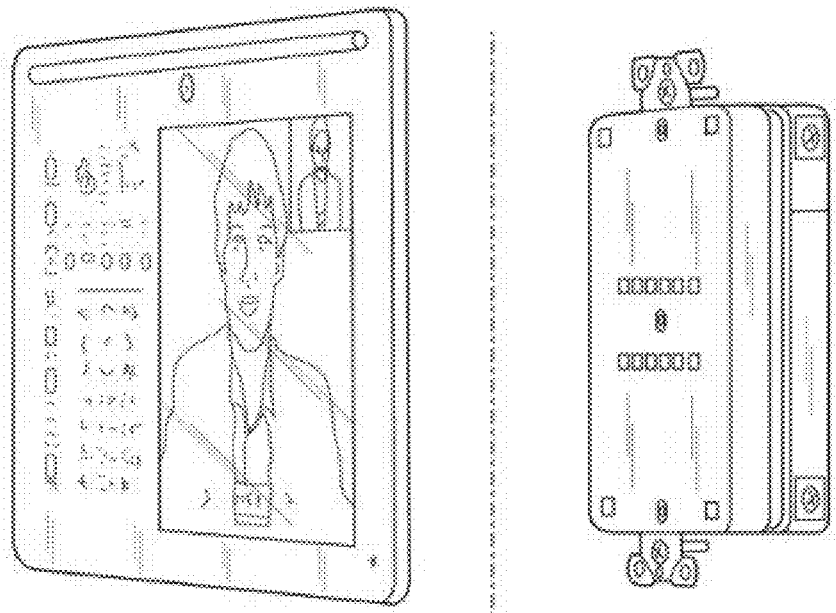
FIG. 10 is a partially exploded perspective view of a unit in accordance with an embodiment of the invention.

The unit 100 may also include a microphone by which the person in the room may speak to the user, or by which the user may listen to what is happening in the room. For example, if the unit 100 is in a baby's room, a grandparent living in another state or country may log into the system and watch and listen to the baby and speak to the baby as well, all via the unit 100. If the unit 100 includes an interface having a screen thereon, like an LCD screen as shown in FIGS. 9-10, the baby can see the grandparent's face and interact with the grandparent. Likewise, the unit 100 may be used as a means for video-chat with someone in the same facility via the local network or outside of the network via an internet connection.

Front panel 120 may also include docking hooks or other connecting mechanisms to connect and power devices such as a phone, a cellular phone or tablet, turning the surface of the connected device into an interface control for the unit 100.

Non-limiting examples of units 100 include an electrical outlet unit 200, a switch unit 300 and a fixture unit 400, as shown in FIGS. 11-14. It is to be understood that unit(s) 100 refers to any or all electric outlet unit 200, switch unit 300 and fixture unit 400. Likewise, component(s) of units 100 refers to corresponding component(s) of electric outlet unit 200, switch unit 300 and fixture unit 400. For example, rear panel(s) 110 refers to any or all rear panels 210, 310, 410; front panel(s) 120 refers to any or all front panels 220, 320, 420; boards 102 refers to any or all boards 202, 302, 402; first board(s) 130 refers to any or all first boards 230, 330, 430; second board(s) 140 refers to any or all second boards 240, 340, 440; faceplate(s) 170 refers to any or all faceplates 270, 370, 470; transceiver(s) 132b refers to any or all transceivers 232b, 332b, 432b.

Preferably, the electrical outlet unit 200 replaces currently existing electrical outlets and fits inside a single gang switch box 600, for example, in a housing having a dimension of 3 inch by 2 inch by 2.5 inch, so that facilities with existing electrical outlets can be retrofitted with the electrical outlet units 200 in accordance with an embodiment of the invention. In accordance with an embodiment of the invention, the electrical outlet unit 200 can turn the device plugged into the electrical outlet unit 200 on or off, or dim it to an intermediate voltage level, for example, via a Triode for Alternating Current (triac) phase control.

Figure 11:
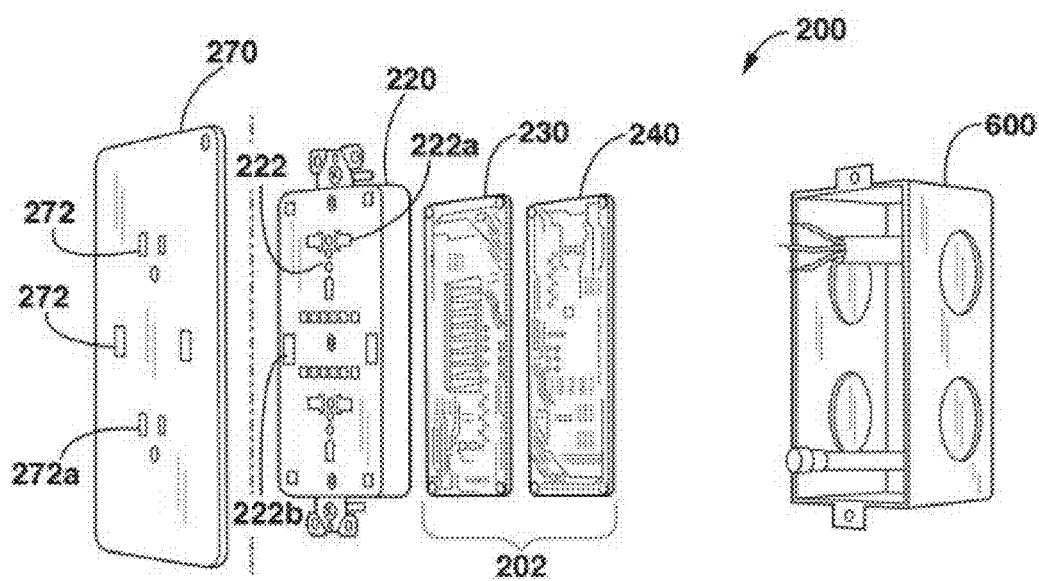
FIG. 11 is an exploded perspective view of an electrical outlet unit in accordance with an embodiment of the invention.
Figure 15:
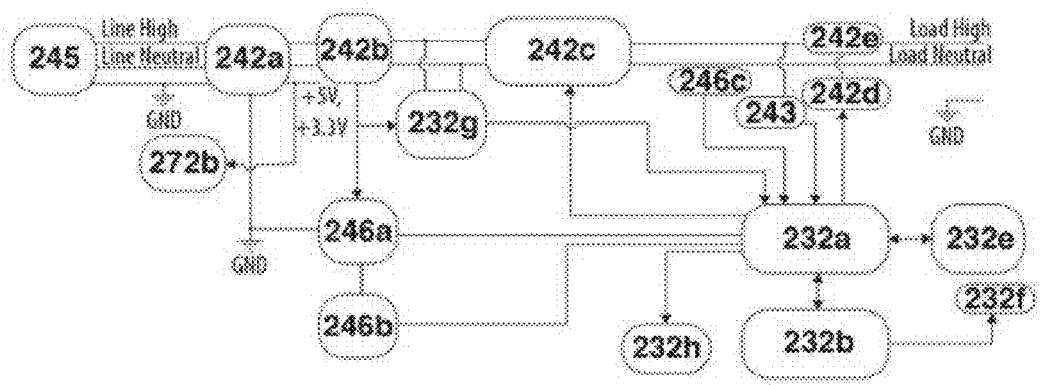
FIG. 15 is a block diagram of an electrical outlet unit in accordance with an embodiment of the invention.
Figure 16:
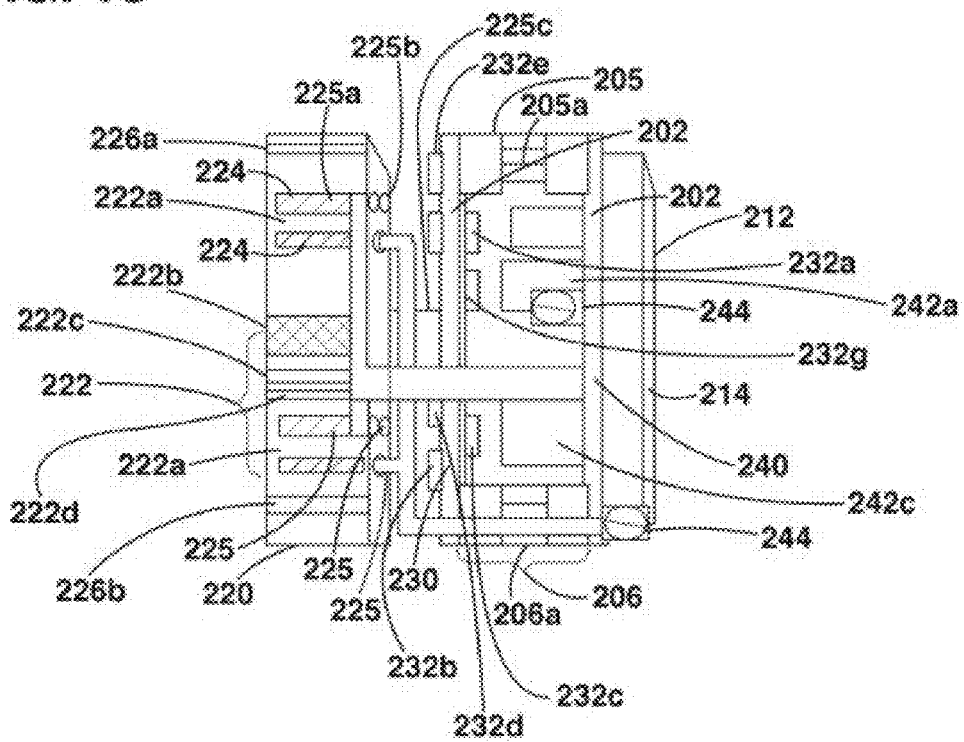
FIG. 16 is a side perspective view of the electrical outlet unit of FIG. 15.

Reference is made to FIGS. 11, 15-16, wherein an electrical outlet unit 200 in accordance with an embodiment of the invention is shown comprising a rear panel 210, one or more boards 202, a front panel 220 and a faceplate 270. In the embodiment shown, the boards 202 comprise a first board 230 and a second board 240. Preferably, the boards 202a re circuit boards, such as a printed circuit board (PCB), a breadboard, a strip board or other structure suitable for electrically connecting components (collectively referred to herein as "circuit board") positioned behind the front panel 220.

In the embodiment shown, faceplate 270 includes a plurality of receiving portions 272 which align with corresponding receiving portions 222 of the front panel 220 for receiving cables, plugs, cords or other means by which power can be provided to a device attached thereto, such that the device can be electrically connected to the electrical outlet unit 200. Referring to FIGS. 11 and 16, the embodiment illustrated has two plug-receiving portions 272a in the faceplate 270 which align with two plug-receiving portions 222a of the front panel 220, each plug-receiving portion 222a constructed and arranged to receive a power plug, for example, to provide power to an electric device, such as a television, radio, toaster, lamp, computer, etc.

Other examples of receiving portions 222 include Universal Serial Bus (USB) ports 222b, mini-USB ports 222c, micro-USB ports 222d, HDMI ports, Ethernet jacks, and telephone jacks. It is to be understood that the receiving portions 222 may include any port or jack constructed and arranged to receive a desired cord, device, etc. as a matter of application specific to design choice and is not limited to the examples provided herein. Alternatively, one or more of such ports or jacks may be integrated into faceplate 270 or a board 202 as a matter of application specific design choice. Preferably, such ports or jacks are connected to the mains outside of the outlet box to avoid the mixing of high and low voltage wiring within the same box.

Figure 17D:
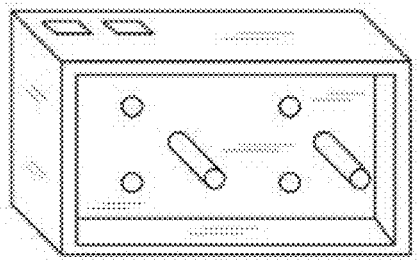
FIG. 17D is a perspective view of a faceplate in accordance with an embodiment of the invention.
Figure 17H:
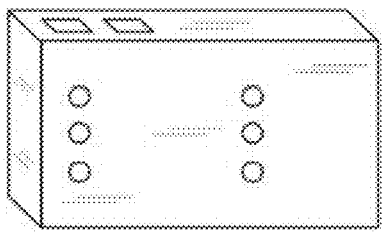
FIG. 17H is a perspective view of a faceplate in accordance with an embodiment of the invention.
Figure 17C:
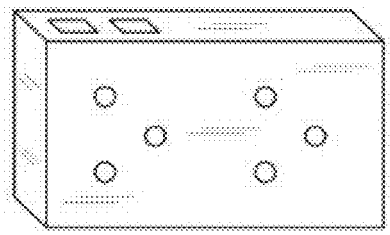
FIG. 17C is a perspective view of a faceplate in accordance with an embodiment of the invention.
Figure 17G:
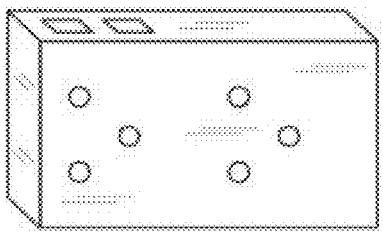
FIG. 17G is a perspective view of a faceplate in accordance with an embodiment of the invention.
Figure 17B:
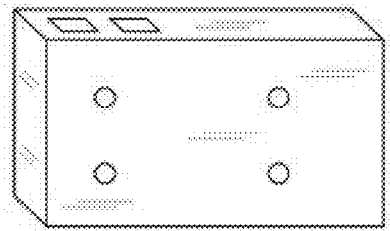
FIG. 17B is a perspective view of a faceplate in accordance with an embodiment of the invention.
Figure 17F:
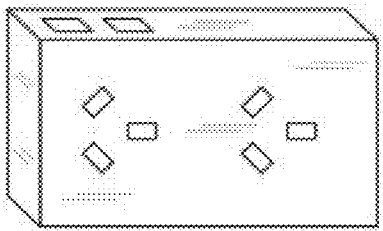
FIG. 17F is a perspective view of a faceplate in accordance with an embodiment of the invention.
Figure 17A:
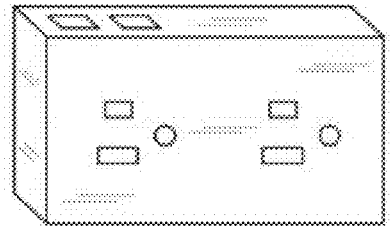
FIG. 17A is a perspective view of a faceplate in accordance with an embodiment of the invention.
Figure 17E:
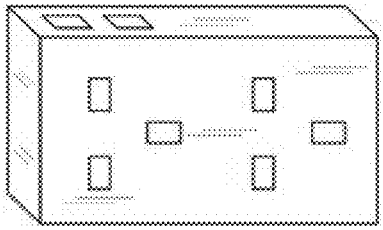
FIG. 17E is a perspective view of a faceplate in accordance with an embodiment of the invention.

In accordance with the embodiment shown in FIG. 11, the front panel 220 includes plug-receiving portions 222a constructed and designed to receive various international configurations for a power plug, preferably most, more preferably all of the international configurations. Accordingly, the faceplate 270 may have plug-receiving portions 272a in specific international configurations. Examples of such faceplates 270 are illustrated in FIGS. 17A-H, wherein faceplate 270 is constructed and designed to receive plugs having the configurations for the Americas and Japan (FIG. 17A), most of Europe (FIG. 17B), India, Sri Lanka, Nepal and Namibia (FIG. 17C), Belgium, France, Poland, Slovakia, Czech Republic, Tunisia and Morocco (FIG. 17D), The United Kingdom, Ireland, Cyprus, Malta, Malaysia, Singapore, and Hong Kong (FIG. 17E), Australia, New Zealand, Papua New Guinea and Argentina (FIG. 17F), Switzerland and Liechtenstein (FIG. 17G), and Italy and parts of Northern Africa (FIG. 17H). It is to be understood that FIGS. 17A-H merely show illustrations and that variations of faceplate 270 are contemplated.

Reference is made to FIG. 16, in which the front panel 220 includes two plug-receiving portions 222a having electrical contacts 224 constructed and arranged to contact the prongs of a plug inserted into the plug-receiving portion 222a. The contacts 224 are preferably fed from three rails 225: the high rail 225a, the neutral rail 225b and the ground line 225c. In the embodiment shown, these rails 225 make connection to the mains, the power source, and ground through conventional screw terminals 244 located on the second board 240. The front panel 220 also includes a USB port 222b, an LED port 226a for a status LED, and additional ports 226b for powering a room temperature sensor, a light sensor, a motion detector or other mechanisms. Such sensors, detectors or mechanisms may be integrated into the front panel 220 or connected directly to the ports 226a, 226b. Alternatively, if such sensors, detectors or mechanisms are provided in the faceplate 270, the contacts for the ports 226a, 226b are arranged on the front panel 220 such that the corresponding sensors, detectors or mechanisms of the faceplate 270 electrically connect to the contacts. The contacts may then be electrically connected to the first board 230 via one or more electrical connectors 204. For example, the electrical connectors 204 may be a 10-pin header connection port. As one of ordinary skill in the art would understand, alternate mechanisms for electrically connecting the lines 225 to the mains, the components from the front panel 220 to the boards 202, and the first board 230 to the second board 240, are contemplated and may be used without deviating from the scope of the invention.

The first board 230 preferably includes circuitry to provide the functions described above. For example, the first board 230 may include a plurality of components, preferably a Micro Controller Unit (MCU) 232a, Radio Frequency (RF) transceiver 232b, GFI controller 232c, AFI controller 232d, program flash 232e, antenna 232f and an energy monitoring device 232g. GFI controller 232c, AFI controller 232d process and interpret the detected signals from the GFI 246a and 246b, respectively. It is to be understood that the GFI 246a and/or AFI 246b may be separate or integrated into the sense coils 242b. The antenna 232f may be integrated unto the first board 230 or provided externally, as matter of application specific design choice. The first board 230 as shown is electrically connected to the second board 240 via electrical connectors 205, 206, preferably by eight-pin headers 205a, 206a on each end of the boards 202 to receive power from the second board 240.

Preferably, commands are received and decoded in the transceiver 232b. If the command is meant for the receiving unit, for example, if the MAC addresses match, the command may be acknowledged back to the coordinator 10 and passed on to the MCU 232a for execution. This bidirectional interface may facilitate the communications of commands and data between integrated circuits.

In accordance with a preferred embodiment of the invention, the MCU 232a processes most, more preferably all, the control commands, requests for data and response to sensors. The MCU 232a is preferably a 16-bit architecture capable of running at least a 16 Mhz cycle time. The MCU 232a preferably performs a plurality of functions. By way of non-limiting example, the MCU may receive and process commands from the transceiver 232b and acknowledge command execution to the transceiver 232b. The MCU 232a may also receive energy data from the energy monitoring device 232g and relay the voltage, current and/or energy data to the transceiver 232b. The MCU 232a preferably calculates power factor and notifies the coordinator 10 if the power factor of the device connected to the electrical outlet unit 200 falls below a specific value, preferably if the power factor falls below 0.8. The MCU 232a preferably also limits current flow based on the total wattage of the load.

The energy monitoring device 232g is preferably a special purpose integrated circuit which measures and records voltage and current flows and calculates the active and apparent energy usage over a period a time. The energy monitoring device 232g may communicate with the MCU 232a through a Serial Peripheral Interface Bus (SPI) port. In accordance with an embodiment of the invention, the MCU 232a queries the energy monitoring device 232g to report, receives the data and then passes it on to the transceiver 232b for communication with the system, for example, by passing it on to the coordinator 10. Examples of data monitored and reported on include, but is not limited to, demand line voltage, load current, active energy, apparent energy and accumulated energy. Room light level and temperature may also be reported. The ratio of apparent energy to active energy can be used to calculate the power factor of the load. When the power factor falls below a preset value, for example, below 0.8, the system may issue a warning and shut down the device connected to the electrical outlet unit.

Other possible functions of the MCU 232a include generating relay activate/deactivate commands based on data received from the network, for example, from coordinator 10. The MCU 232a is preferably capable of over-the-air programming by receiving such programming or system updates from the coordinator 10. The MCU 232a may also store configuration parameters and current states for recovery via a program flash 232h. Preferably, the MCU 232a is expandable for further enhancements and additions to the electrical outlet unit 200.

The MCU 232a may receive and process line sync pulses 243 for the main interface driver, generate timed trigger pulses for dimming based line sync and dim set points and process line sync pulses 243 for the main interface driver, and modify the timing of dimming trigger pulses to produce different dimming profiles.

The main interface is an integrated circuit that optically couples signals from the mains to generate the sync pulse required by the triac circuitry. The coupler detects each time the main AC voltage crosses through zero volts and generates a positive output pulse. For a standard 60 cycle system, these occur every 8.33 milliseconds. These pulses are used by the triac dimming control driver 242d to determine the beginning of each dimming cycle and trigger the dimming control triac 242e accordingly.

The MCU 232a preferably receives, processes, and monitors internal temperature information of the electrical outlet unit 200 for compliance under the conditions, and translates to the control relay 242c to deactivate if not in compliance. The current flow and temperature may also be monitored and limited by the MCU 232a. Preferably, the electrical outlet unit 200 is capable of supporting up to 20 amps in an on/off application and 15 amps in a dimming configuration. The MCU 232a also may generate status indicators for digital or other display as appropriate. For example, the status may be "Connected" or "Fault."

Whereas FIG. 15-16 show embodiments wherein the MCU 232a and the transceiver 232b are separate, it is to be understood that the MCU 232a and the transceiver 232b may be integrated into a single circuit without deviating from the scope of the invention. If the MCU 232a and transceiver 232b are separated, the communications preferably occur on a Serial Peripheral Interface Bus (SPI).

An additional role of the transceiver 232b may be to inform the MCU 232a upon a prolonged loss of communications with the coordinator 10. The MCU 232a may then take appropriate action to indicate this state. For example, if there is a loss of communication, the electrical outlet unit 200 may default to full on.

The first board 230 preferably includes a visible status indicator, for example, an LED indicator visible through or outside of the faceplate 270. Preferably, the faceplate 270 includes one or more apertures or lenses through which the LED indicator can be seen. The LED indicator may have a plurality of colors or states, each indicating a different status of the electrical outlet unit 200. For example, if the LED is off, it may indicate that the electrical outlet unit 200 is offline. A red LED may indicate a fault, and a flashing red LED may indicate an imminent fault. A greed LED may indicate that the electrical outlet unit 200 is online and working properly, and a flashing green LED may indicate that the electrical outlet unit 200 is attempting to join or rejoin the network.

The second board 240 preferably includes a plurality of components, by way of non-limiting example, a power supply 245, voltage suppression/power converter device 242a, current sense coils 242b, control relay 242c, triac dimming control drivers 242d, dimming control triac 242e, and thermal sensor 246c. In accordance with a preferred embodiment of the invention, units 100, including electrical outlet units 200, switch units 300 and fixture units 400, comprise a common second board 140, which may facilitate manufacturing, installation and interchangeability of the units 100. The illustrated second board 240 also contains screw terminals 244 which electrically connect the electrical outlet unit 200 to the mains.

In the embodiments illustrated in FIG. 16, a heat sink 212 on which the triac dimmer 214 is mounted is attached to the back of the second board 240, preferably on the opposite side of the second board 240 from the first board 130. The heat sink 212 is preferably able to fully dissipate the maximum power in the triac dimmer 214 in the environment while maintaining a case temperature of less than 100° C. By way of non-limiting example, if the maximum power in the electrical outlet unit is 23 watts for the triac dimmer 214, the thermal resistance for the heat sink is preferably less than 2.1° C./Watt.

FIG. 15 provides a block diagram for an embodiment of an electrical outlet unit 200, illustrating its power path and signal path between the components. In the embodiment shown, power enters the electrical outlet unit 200 from the power supply 245, upon which it is conditioned by a voltage suppression/power converter device 242a. The device 242a is designed to reduce the amount of Radio Frequency Interference (RFI) which is reflected back on the mains by the electric outlet unit 200. Devices with internal dimming circuits can generate large amounts of interference, and many countries require control on the magnitude of RFI generated by a dimming device. Therefore, it is preferred to reduce the RFI level, more preferably to meet or exceed the European Union (EU) requirements for Electrical Lighting and Similar apparatus—EN55015.

The device 242a may be a metal oxide varistor (MOV). The literature shows 80% of all line transients have a duration between 1 and 10 μs and amplitudes up to 1.2 kV, which occur more than 10 times per day. Therefore the MOV device preferably has a voltage and energy rating capable of absorbing these transient without significant degradation over time. The varistor is preferably rated for a continuous 300 Volts AC with a clamping voltage of about 400 volts. Preferably, the energy rating is at least 50 to 75 joules.

The device 242a illustrated also includes a switching regulator, which converts the high AC voltage of the mains to a lower DC supply voltage to power the electrical outlet unit 200. Preferably, the switching regulator is capable of generating 5 volts and 3.3 volts.

The embodiment of the electrical outlet unit 200 also includes a USB charging port 272b. USB charging usually requires a handshake or enumeration between the host device (charger) and the USB device to be charged. This function may limit the charging current flow to the device depending on the level of charge required. The electrical outlet unit preferably utilizes an application specific integrated circuit to drive the USB port. Although the USB 3 specifications allow current draws of up to 2 amps, practical limitation (like the current limit of connectors) may limit the available current, for example, to 500 ma.

In accordance with an embodiment of the invention, the total current required from the low voltage switching regulator is about 800 ma, with an output current of 1 ampere. Given the current requirements of the power converter switching regulator, there are several other factors to consider before choosing a circuit configuration. First, the regulator preferably interfaces directly from the mains, eliminating the need for a bulky transformer which takes up space and may require personalization for different voltage configurations. Second, the output of regulator is preferably non-isolated, thus obviating the need for an internal isolation transformer and its associated cost and area. Third, given the high currents required, the regulator device is preferably mounted on a heat sink to dissipate the power as in the illustrated embodiment of FIG. 16. Some or all of these factors may come into play in determining the final output specifications of the switching regulator.

The device 242a preferably also includes low-dropout (LDO) regulator to convert the +5 volts to +3.3 volts for the MCU and wireless network radio components.

As mentioned above, there are preferably several safety related detectors integrated into the electrical outlet unit 200. For example, electrical outlet unit 200 preferably includes a Ground Fault Interrupter (GFI) 246a and Arc Fault Interrupter (AFI) 246b as well as an internal thermal sensor 246c, which preferably detects overload. The GFI 246a may protect people from electrical shock from a faulty appliance or an accidental insertion of an object into the outlet. A GFI 246a monitors the amount of current flowing from hot to neutral. If there is any imbalance, it preferably trips the control relay 242c. Preferably, it is able to sense a mismatch as small as 4 or 5 milliamps, and can react in milliseconds, thus removing the hazardous condition before harm can occur. An AFI 246b detects abnormal circuit conditions such as spikes in operating current. These spikes can be caused by loose connection or damaged wire. These conditions not only waste energy, but they could eventually cause overheating and a fire. By monitoring the current flow and analyzing changes in conditions, the AFI 246b can also trip the control relay 242c to alleviate the hazard in case where abnormal conditions are recurring.

In the illustrated embodiment, the GFI 246a utilizes two sensing coils 242b to monitor the current flow in the high line and the neutral line of the main. These signals are amplified in an integrated circuit which sends out a fault signal when the differential current exceeds 4 to 5 ma. This signal is processed by the MCU 232a which opens the control relay 242c and removes drive to the triac circuitry comprising triac dimmer 214 and triac dimming control driver 242d. Since the triac is a fast-reacting device, the electrical outlet unit 200 preferably responds faster than conventional GFI circuits. Preferably, the response time is a few milliseconds as compared to 75 milliseconds in a conventional relay drive device.

In the illustrated embodiment, the AFI detector 246b also utilizes the signals from the sensing coils 242b. This signal is presented to the analog to digital converter input of the MCU 232a. The digitized signals are processed by an auto correlation algorithm to identify the fundamental or periodic portion of the signal. Deviations from the expected or fundamental signal can now be analyzed for amplitude and repetitiveness. An intermittent fault caused by a defective connection, a frayed or broken wire can be detected. Because the processing requires complex analysis of the current wave forms to discriminate between a normal and abnormal operation, the MCU 232a may be busy processing other commands and functions, such as dimming functions and processing energy readings, and therefore may not be able to perform the AFI calculations and provide a real-time response, an auxiliary MCU may be included in unit 100 and be dedicated to perform the correlation calculations. After processing, the auxiliary MCU sends a signal to the main MCU 232a, which deactivates the control relay 242c and sends an alarm to the system, preferably through the wireless network.

In the embodiment shown, a thermal sensor 246c, for example, a temperature sensor circuit 246c, is included with a sensor diode attached to the heat sink 212. The MCU 232a monitors internal temperature of the electrical outlet unit 200 and signals a fault if the maximum operating temperature, for example, 90° C., is exceeded. This condition will deactivate the control relay 242c as a safety measure and send an alert to the system. The MCU 232a also monitors the expected temperature based on the current operating conditions and signal an alert if it is excessive.

The triac dimming control driver 242d is preferably an integrated circuit to amplify and translate the control signal out of the MCU 232a to drive the triac dimmer 214.

Figure 12:
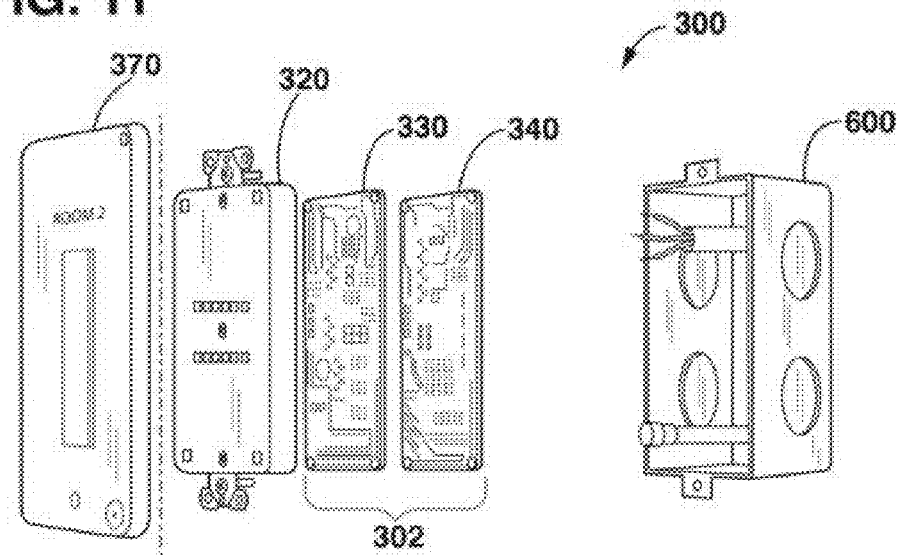
FIG. 12 is an exploded perspective view of a switch unit in accordance with an embodiment of the invention.
Figure 13A:
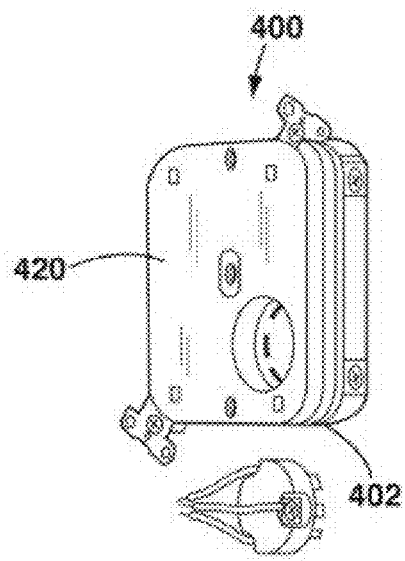
FIG. 13A is a perspective view of a fixture unit in accordance with an embodiment of the invention.
Figure 13B:
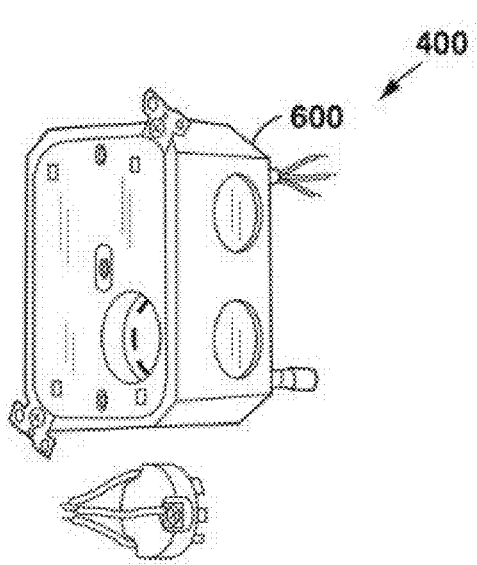
FIG. 13B is a perspective view of the fixture unit of FIG. 13A inserted into an electrical box.
Figure 14:
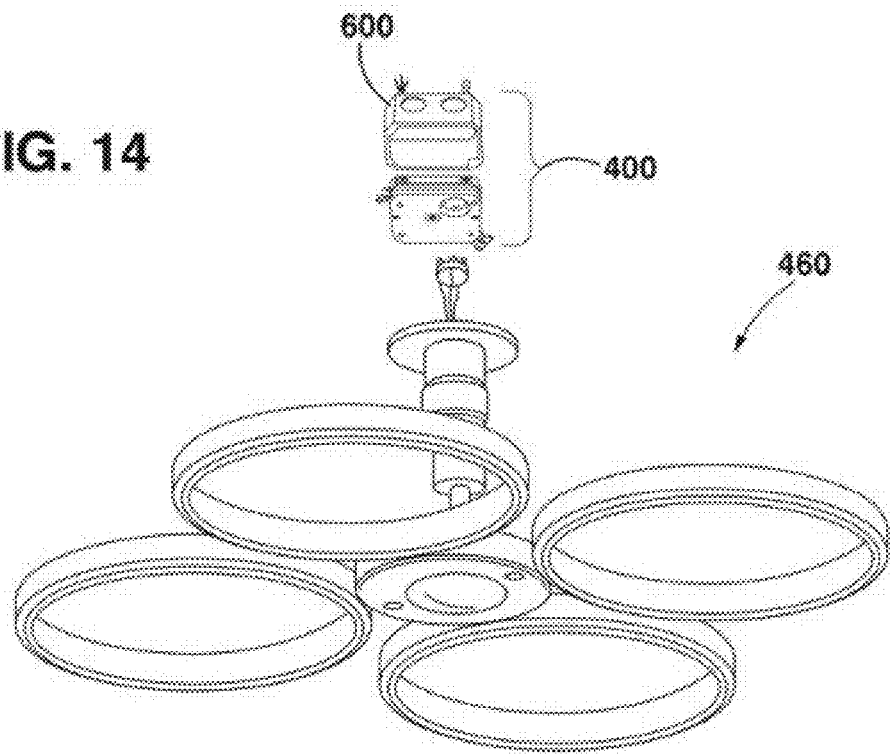
FIG. 14 is an exploded view of the fixture unit and electrical box of FIG. 13B with a ceiling fixture.
Figure 18:
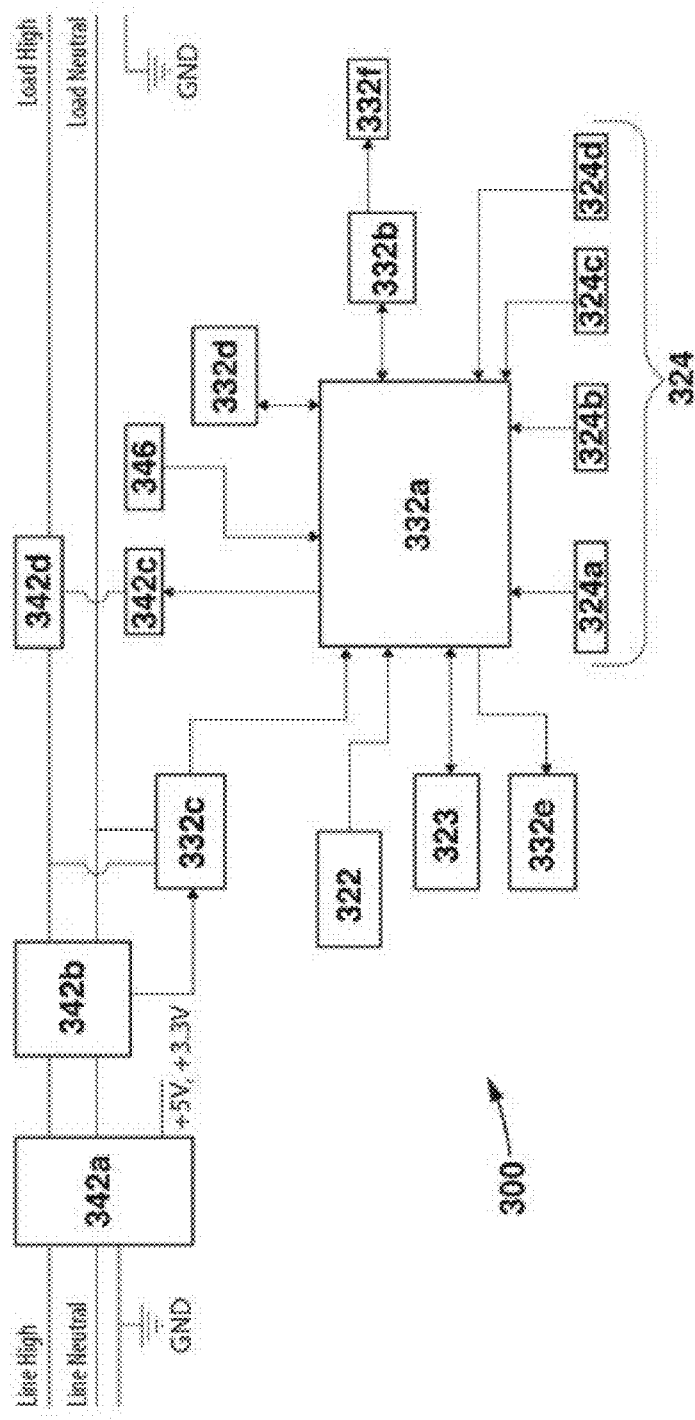
FIG. 18 is a block diagram of a switch unit in accordance with an embodiment of the invention.
Figure 19:
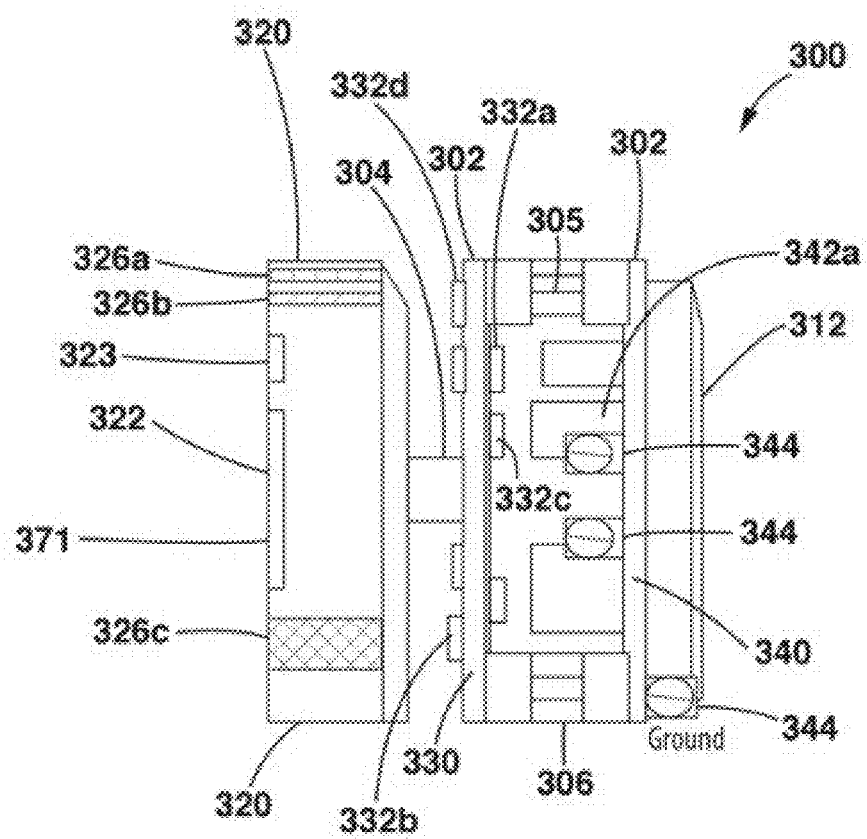
FIG. 19 is a side perspective view of the switch unit of FIG. 18.
Figure 20:
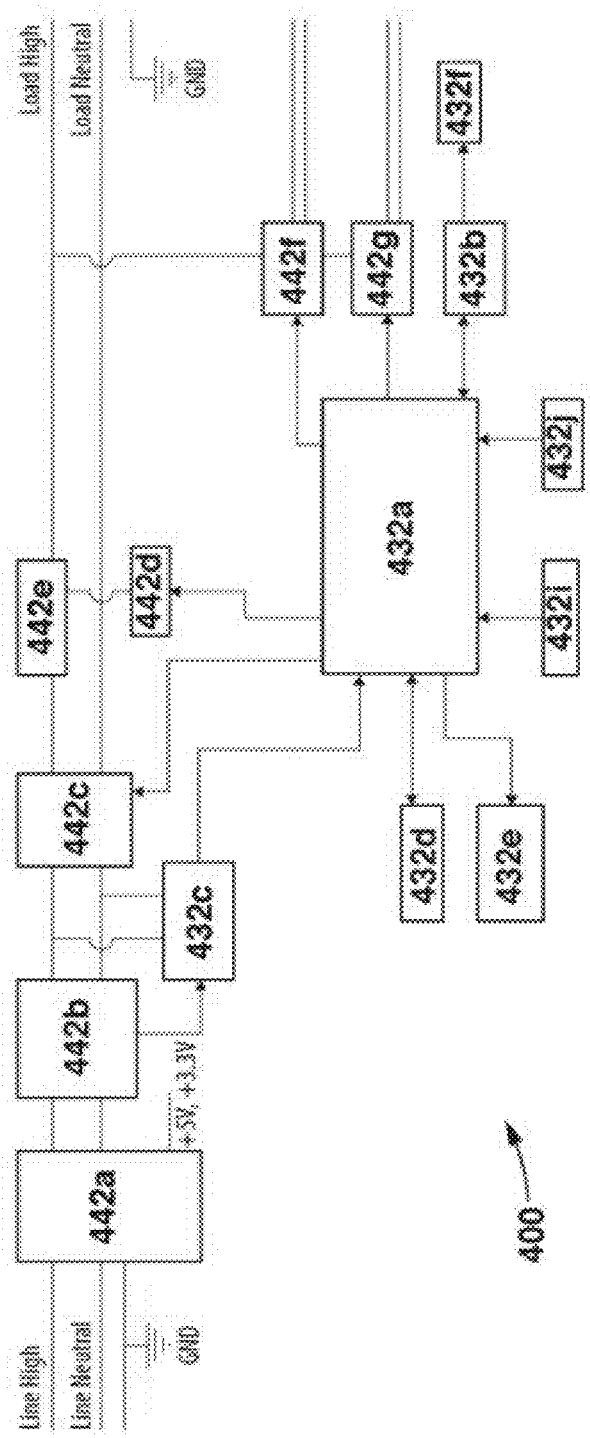
FIG. 20 is a block diagram of a fixture unit in accordance with an embodiment of the invention.
Figure 21:
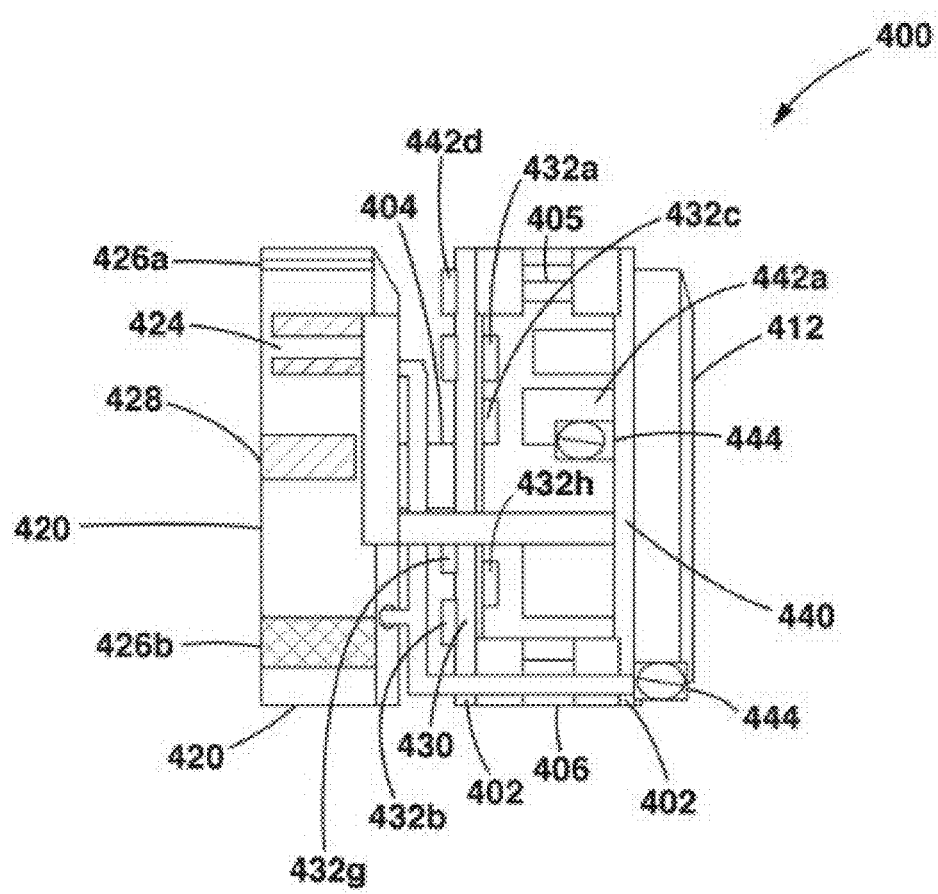
FIG. 21 is a side perspective view of the fixture unit of FIG. 20.

Switch unit. Reference is made to FIGS. 12, 18-19, wherein certain exemplary embodiments of the switch unit 300 are shown. The switch unit 300 preferably provides an interface for interaction with a user. For example, the switch unit 300 may have a manual switch, such as a touch slide switch, a toggle switch, a push button switch, a membrane switch, a touch pad, a touch screen and any electronic device that may make or break an electrical circuit, constructed and arranged to control a device connected thereto, or a unit 100 in the system. For example, the switch unit 300 may be connected by conventional wire(s) to one or a group of lights, fans or units 100.

Preferably, the switch unit 300 replaces currently existing light switches and fits inside a single gang switch box 600. In accordance with an embodiment of the invention, the switch unit 300 can turn on or off or dim the lighting device electrically connected thereto. Alternatively, if the switch unit 300 controls a different device, the dimming function may be used to reduce the power provided to the device. The switch unit 300 preferably also includes a thermostat function to monitor and control the temperature of the room in which it is located.

The boards 302 of the switch unit 300 may have some or all of the components of the boards 202 of the electrical outlet unit 200, preferably with additional components. Alternatively, some of the components of the boards 202 may be excluded from boards 302 of the switch unit 300. As will be discussed below, boards 102 of units 100 in general may have the same components such that a user can simply place the desired front panel 120 to obtain the functions desired, providing a fully interchangeable system. In the embodiments shown in FIGS. 12, 18-19, the boards 302 of the switch unit include some, but not all, of the same components as the boards 202 of the electrical outlet unit 200 and also includes some additional components. Accordingly, some of the differences between the illustrated embodiments of the switch unit 300 and electrical outlet unit 200 will be discussed herein.

For example, the illustrated embodiments of switch unit 300 include a heat sink 312, an MCU 332$a$, transceiver 332$b$, energy monitor 332$c$, program flash 332$d$, status indicators 332$e$, antenna 332$f$, voltage suppression/power converter device 342$a$, current sense coils 342$b$, triac dimming control drivers 342$c$, dimming control triac 342$d$, and thermal sensor 346, an LED port 326$a$ for a status LED, and additional ports 326$b$, 326$c$ for powering a light sensor 324$a$, a room temperature sensor 324$b$, a carbon monoxide detector 324$c$, a motion detector 324$d$ or other mechanisms, screw terminals 344, wire connectors 304, electrical connectors 305, 306; but does not include a USB charging connection, a GFI 246$a$, an AFI detector 246$b$, control relay 242$c$ and the associated components thereof. Therefore, if the MCU 332$a$, which monitors internal temperature, signals a fault indicating the maximum operating temperature is reached, the triac driver 342$c$ is deactivated as a safety measure.

Similar to the electrical outlet unit 200, the transceiver 332$b$ of the switch unit 300 preferably receives and decodes the commands. Some commands, for example, the on/off and dimming commands, may be received from the system over the local network to control either the triac dimmer 214 on the switch unit 300 or relayed to another unit 100 for execution.

The MCU 332$a$ of the illustrated switch unit 300 performs the same functions as MCU 232$a$ of the electrical outlet unit 200, except for relaying activate/deactivate commands and processing signals for GFI and AFI. However, the MCU 332$a$ also responds to user input from the user interface 321 of the front panel 320, such as a touch pad 322, and displays status on the user interface 321, such as an LCD (liquid-crystal display) display 323. The LCD display 323 is preferably capable of displaying alpha-numeric characters and displays either the room temperature or the dim status. Additionally, MCU 332$a$ translates signals from the system and displays the status on the touch pad 322 and/or relays the translated signals to joined units 100 as appropriate. The switch unit 300 may be connected via its dimmer to a load device, such as a light fixture or a fan, and thus the energy utilized by this load device is preferably monitored and reported by the energy monitoring device 332$c$ to the coordinator 10.

The MCU 332$a$ illustrated also processes signals from one or more sensors 324, such as a light sensor 324$a$, a room temperature sensor 324$b$, a motion sensor 324$c$ and a carbon monoxide sensor 324$d$, and transmits to the coordinator 10 for processing responses. The light sensor 324$a$ may sense ambient light and facilitate the system making adjustments to optimize energy consumption while maintaining a certain level of illumination. Preferably the light sensor 324$a$ can detect a luminance change range of 100 times, for example, from 0.02 mw/cm$^2$ to 2 mw/cm$^2$. The room temperature sensor 324$b$ preferably detects and reports the temperature of the room or space in which the switch is located. Preferably, the effective temperature range is between 0 to 100 degrees Fahrenheit. The room temperature sensor 324$b$ may also be used to interface and control HVAC (heating, ventilation and air conditioning) systems. The light sensor 324$a$ and temperature sensor 324$b$ may be integrated into the front panel 320 or connected to the front panel 320 via port 326$b$. Alternatively, it is to be understood that the sensors may be integrated into or connected to the first board 330.

The motion sensor 324$c$ preferably detects and reports the times and days of movements detected. Accordingly, the system may develop custom profiles for the location, which may facilitate anticipating customs and practices. The motion sensor 324$c$ preferably has a detection distance of about 10 m or more, and a detection angle of greater than about 100 degrees vertically and horizontally. The carbon monoxide sensor 324$d$ preferably can detect from 1 ppm to 10,000 ppm and includes an internal alarm for immediate alert, and notifies the coordinator and preferably links to safety and security agents. Preferably, the carbon monoxide sensor 324$d$ has a response time of less than 60 seconds. The motion sensor 324$c$, the carbon monoxide sensor 324$d$ and/or other components may be connected to the front panel 320 of the switch unit 300 via a port 326$c$, for example, a USB port.

Fixture unit. Reference is made to FIGS. 13A, 13B, 14, 20-21, wherein certain exemplary embodiments of the fixture unit 400 are shown. Similar to the embodiments of the electrical outlet unit 200 and switch unit 300 described herein, the fixture unit 400 is preferably powered off the mains and has universal connectivity to a wide range of voltages and generation frequencies. An embodiment of the fixture unit 400 fits into four by four square electrical boxes 600 currently available in the art and provides wireless control directly at the fixture 460. It has conventional on/off capability, complemented by three different modes of driving the dimming function: a standard dimming control triac 442$e$ for traditional applications; an analog 0 to 10 dimmer 432$g$ for dimming of electronic controllable ballasts and a pulse width control module (PWM) 432$h$ for LED dimming. The fixture unit 400 may respond to wireless commands from the coordinator 10 or from a switch unit 300 to control the fixture 460 electrically connected thereto.

In accordance with a preferred embodiment, the fixture unit 400 has one or more of a smoke, carbon monoxide and motion detectors integrated into the fixture unit 400, either as standalone units or used in correlation with the fixture 460. The fixture unit 400 is preferably attached to the top of light fixtures. However, for fluorescent light fixtures, the fixture unit 400 is preferably mounted inside the troffer by the ballast.

The boards 402 of the fixture unit 400 may have some or all of the components of the boards 202, 302 of the electrical outlet unit 200 and/or switch unit 300, preferably with additional components. Alternatively, some of the components of the boards 202, 302 may be excluded from boards 402 of the fixture unit 400. In the embodiment shown in FIGS. 20-21, the boards 402 of the fixture unit 400 include some, but not all, of the same components as the boards 202 of the electrical outlet unit 200 and also includes some additional components. Accordingly, some of the differences between the illustrated embodiments of the fixture unit 400 and electrical outlet unit 200 will be discussed herein.

For example, the illustrated embodiments of fixture unit 400 include a heat sink 412, an MCU 432$a$, transceiver 432$b$, energy monitor 432$c$, program flash 432$d$, status indicators 432$e$, antenna 432$f$, an analog dimmer 432$g$, PWM 432*h*, smoke detector 432*i*, motion detector 432*j*, voltage suppression/power converter device 442*a*, current sense coils 442*b*, control relay 442*c*, triac dimming control drivers 442*d*, dimming control triac 442*e*, PWM driver 442*f*, analog dimmer driver 442*g*, an LED port 426*a* for a status LED, and additional ports 426*b*, preferably a USB port, for powering a smoke detector 432*i* or motion detector 432*j* or other mechanisms, a dim connector 428, screw terminals 444, wire connectors 404, electrical connectors 405, 406; but does not include a USB charging connection, a GFI 246*a*, an AFI detector 246*b*, and the associated components thereof.

The voltage suppression/power converter device 442*a* is preferably the same as the device 242*a* of the electrical outlet unit 200, with an additional circuitry to generate a drive source for the LED and analog control signal voltages.

As mentioned above, the illustrated embodiment of the fixture unit 400 includes an analog dimmer driver 442*g* and an LED PWM driver 442*h*. The analog dimmer driver 442*g* is a separately generated DC control signal with a range of zero to ten volts, derived from a variable width pulse provided from the MCU 432*a*. This pulse is processed by a buck switching regulator to generate the voltage level requirements. The analog zero to ten volt dimmer will support a current source or sink of 200 milliamps. The LED PWM driver 442*f* is a constant current source capable of driving loads up to 25 watts. It preferably utilizes a driver integrated circuit, which will be driven off the relay side of the mains and dimmed by pulses generated by the MCU 432*a*.

The transceiver 432*b* preferably receives and decodes commands, such as the on/off and dimming commands, which may be received from the coordinator 10 or a switch unit 300. In addition to the functions of the transceiver 232*b* of the electrical outlet unit 200, for embodiments having multiple configurations, the commands preferably control the on-board triac dimmer 442*e*, analog dimmer 432*g* or LED PWM dimmer 432*h*.

The MCU 432*a* of the embodiment of the illustrated fixture unit 400 performs the same functions as MCU 232*a* of the electrical outlet unit 200, except processing signals for GFI and AFI. However, the MCU 432*a* also processes signals from one or more sensors, such as a motion detector 432*j* and a smoke detector 432*i*, and transmits to the coordinator 10 for processing responses. The MCU 432*a* also generates timed variable duty cycle pulses to drive the analog dimmer driver 442*g* and LED PWM driver 442*f*, and modifies the timing of the dimming pulse widths to produce different dimming profiles.

The motion detector 432*j* preferably detects movements to activate lights or other trigger alarms. The information from the motion detector 432*j* may be stored and used to develop custom user profiles for the location. These profiles may be used to anticipate customs and practices. The motion detector 432*j* preferably has a detection distance of about 10 m or more, and a detection angle of greater than about 100 degrees vertically and horizontally. The smoke detector 432*i* preferably includes an internal alarm for immediate alert, notifies the coordinator 10 and links to safety and security agents.

The examples provided are merely exemplary, as a matter of application specific to design choice, and should not be construed to limit the scope of the invention in any way.

Thus, while there have been shown and described and pointed out novel features of the present invention as applied to preferred embodiments thereof, it will be understood that various omissions and substitutions and changes in the form and details of the disclosed invention may be made by those skilled in the art without departing from the spirit of the invention. For example, the arrangement of the components, including which components are provided on which board or front panel or faceplate may be changed without deviating from the scope of the invention as a matter of application specific to design choice.

The communication system by which the units, coordinators and servers communicate may be varied as well. The system may be all wireless, all wired, or any combination thereof. The system may eliminate the coordinator and have the units communicate with the local or remote server directly. The system may eliminate the local server and have the coordinator process all the data and initiate commands to the units. The units may process the commands itself, as well as perform the other functions of the coordinator. The units may be configured to function as a wireless router to other devices in the network via which the devices can connect to other devices on the network or connect to the Internet.

The units may include a battery or some mechanism for retaining energy, so that the units can continue to function in the event of a blackout. The front panel itself may include a battery or some mechanism for retaining energy. For front panels having a communication mechanism, such as a microphone, speaker, screen, etc., a user may remove the front panel from the boards of the unit and continue using the communication mechanism thereof. Or, the front panel may be used as a portable charging dock, for example, for cellular phones, tablets, etc.

The units may include a surge protecting mechanism to protect the unit itself and/or the device connected thereto from a sudden surge in electricity. The faceplate or front panel may attach to the electrical box and not directly to the boards. The unit may include a housing in which the boards, or the boards and the front panel, or the boards, the front panel and the faceplate are housed, providing a unitary device.

It is to be understood that whereas the term "coordinators" is used herein, the referred to "coordinators" need not "coordinate." Rather, a coordinator may be connected to a single unit, or have a single function, or varied in any way such that it may not be considered "coordinating," without deviating from the scope of the invention.

Snap-in Power Lines

Figure 22:
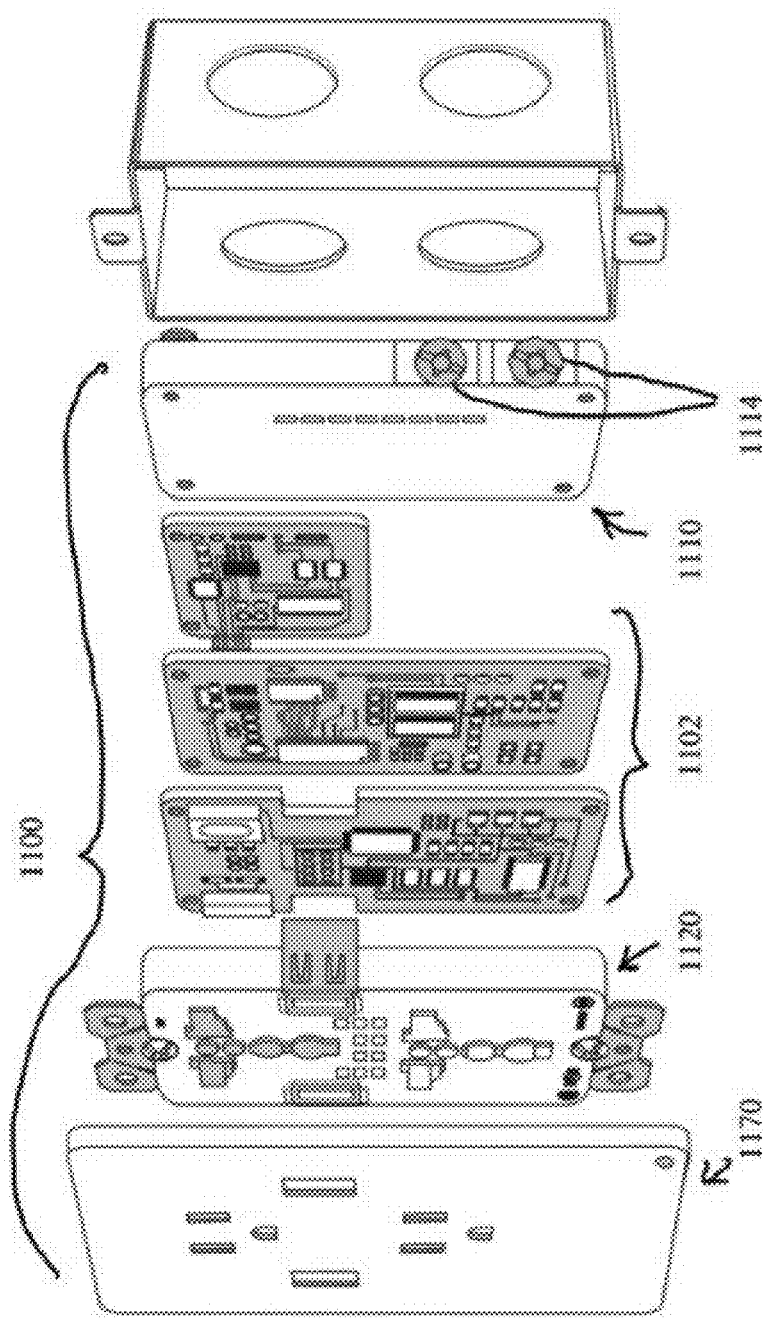
FIG. 22 is an exploded perspective view of a unit in accordance with an embodiment of the invention.
Figure 23:
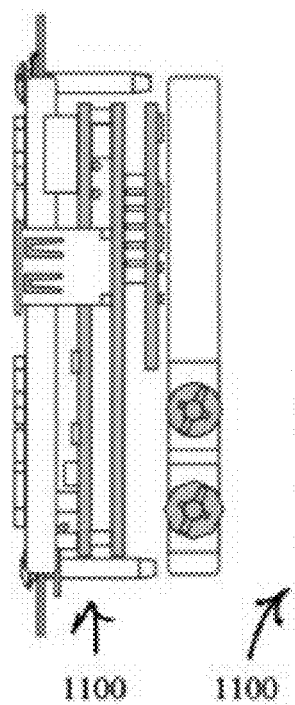
FIG. 23 is a side view of a unit in accordance with an embodiment of the invention.

Referring to the embodiment shown in FIGS. 22-23, a unit 1100 includes a faceplate 1170, a rear panel 1110, a front panel 1120 and boards 1102. As shown, rear panel 1110 includes a plurality of screw terminals 1114, a neutral screw terminal 1114A, a ground screw terminal 1114B, and a hot screw terminal 1114C, to connect to the main, a power source and ground, preferably via wires in the wall, beneath the floor, above the ceiling, etc. The wires are preferably wound around the screws of the screw terminals 1114 to permit current flow between the wires and the screw terminals 1114.

Figure 24:
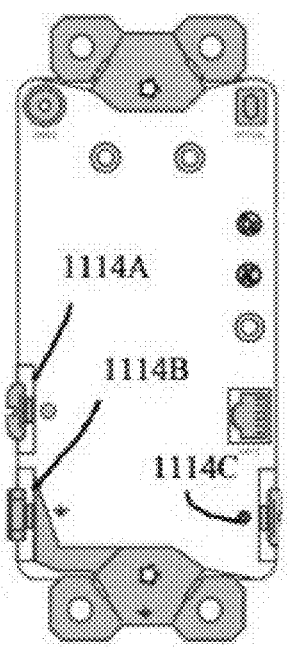
FIG. 24 is a rear view of the unit of FIG. 23.

Reference is made to FIGS. 24-28, in which an embodiment of a system and unit 1200 are shown. FIG. 24 shows the back of a rear panel 1210 having a plurality of terminals 1214 constructed and arranged to receive corresponding connectors 1250. Each terminal 1214 as shown defines a cavity for receiving a connector 1250, which is preferably crimped onto a wire. FIG. 27 shows an embodiment of three wires extending from a wall, each wire connected to a connector 1250. The wires are separated into neutral, hot and ground, and can be inserted into the respective terminals 1214 of unit 1200. Unit 1200 as shown includes a neutral terminal 1214A, a ground terminal 1214B and a hot terminal 1214C. Preferably, the terminals 1214 and connectors 1250 are color-coded to identify which connector 1250 should be inserted into which terminal 1214. Alternatively or in combination thereto, the different connectors 1250 may have a different size and/or shape, so that it may only be inserted into its corresponding terminal 1214 having the same size and/or shape cavity. Whereas the terminals 1114 and connectors are illustrated as cavities and inserts, respectively, one of ordinary skill in the art would appreciate that other mechanisms and arrangements may be used and are contemplated without deviating from the scope of the invention.

Preferably, an electrician separates the wires from within the wall, floor or ceiling, or from behind or extending through the electrical box, into neutral, ground and hot, and crimps on or otherwise attaches the connectors 1250 to the respective wires. Once the connectors 1250 are attached to the wires, a user may insert the respective connectors 1250 into the corresponding terminals 1214 of unit 1200. This preferably facilitates removing or replacing unit 1200 from the wall, floor, ceiling, or wherever the wires are.

In the embodiment shown in FIGS. 24 and 25, units 1100, 1200 include additional ports, such as a coaxial cable port, an optical port and an Ethernet port, such as a CAT 5 port.

In accordance with an embodiment of the invention, a kit preferably includes a crimper 1260 as shown in FIG. 28 and a plurality of connectors 1250. The kit may also include one or more units 1200 or rear panels 1210. If a rear panel 1210 is provided, the existing rear panel 1110 of a unit 1100 having screw terminals 1114 may be replaced with the rear panel 1210 to render the units suitable for use with connectors 1250. Preferably, the crimper 1260 can cut the wire prior to crimping the connector 1250 onto it. It is to be understood that different tools for attaching connectors 1250 to the wires can be used and/or provided, and the kit may include additional items without deviating from the scope of the invention.

The connectors 1250 may be used with other electrical outlets without unit 1200. The rear panel 1210 or another panel having terminals 1214 may be attached to existing outlets or other electrical outlets to facilitate removal and/or replacement of such outlets, or the terminals 1214 may be connected directly to the outlets. Therefore, outlets having terminals 1214 may be replaced by a user without the need to call a mechanic or handling potentially dangerous wires.

In the embodiment illustrated, the connectors 1250 are inserted into terminals 1214 whereupon it can snap into place so that it is not inadvertently dislodged. However, it is to be understood that any other mechanism for connecting connectors 1250 to terminals 1214, preferably mechanisms which prevent inadvertent disconnection thereof, are contemplated and included. Non-limiting examples include threaded connectors and terminals, magnets, hook-and-eye connectors, adhesives, sliding mechanisms, straps, etc.

Visible Light Communication System

Li-Fi Capabilities. In accordance with an embodiment of the invention, the system uses a light network, for example, an LED (light-emitting diode) light network, referred to generally herein as Li-Fi (light fidelity) wireless communication system by which the units 100 may communicate with other units 100 and/or other devices. A Li-Fi system may be preferred to reduce energy consumption and carbon dioxide ($CO_2$) emission. A Li-Fi system may also provide a faster rate of data transfer, a more secure network, and a greater capacity, for example, compared to a WiFi system. Generally a Li-Fi system is free from neighboring network and radio interference, and prevents a third party from piggy-backing on the network or intercepting data being transmitted without a clear line of sight of the transmitter. Another potential benefit of a Li-Fi system is the ability of use in electromagnetic sensitive areas such as aircrafts, hospitals and nuclear power plants, without causing electromagnetic interference.

One of more units 100 preferably are capable of wirelessly charging devices, by way of non-limiting example, smartphones and tablets. In accordance with an embodiment, such wireless charging may be accomplished over a Li-Fi system.

Devices within the network, such as appliances, electronics, ceiling fixtures, alarm systems, etc. may include identifiers, such as computer chips, for example, RFID chips, which include data regarding such device.

RFID Tracking and Monitoring

In accordance with an embodiment of the invention, one or more units 100 include RFID readers for reading RFID tags on assets, vehicles, people, animals, etc. The RFID tags are preferably included in a device referred to herein as "badge devices." Such a system may provide monitoring of their movement, permitting or preventing access to certain areas, opening of the gate for vehicles before the vehicle arrives, thus eliminating the need to stop at the gate, tracking the movement of assets, monitor environmental conditions of certain areas in which the RFID tag is located, etc. For example, if every patient in a hospital has a badge device on them, every time they are moved from room to room, the units 100 that he passes will scan his badge and record his location, vitals and environmental conditions. The system may provide a link to the patient's schedule, such that if the patient is moved to an improper room, for example, the MRI room instead of the X-ray room, the system may send a notification to the nurse, nurse's station, etc. Such a system may be useful for keeping track of patients with a tendency to wander or are disoriented, such as patients with dementia or brain trauma.

Tags may also be attached to or placed proximate medical supplies, and may provide information on the environment of such supplies. For example, the temperature, humidity and other environmental conditions may be critical for certain supplies. Therefore, it may be preferred to have tags in certain rooms, attached to containers, carts, equipment, etc. to monitor the environmental conditions of such medical devices regardless of where such devices are located. The system may also provide a report on the results of the reads for a user or the raw data for the user to use as he sees fit.

Non-limiting examples of uses of RFID tags with an embodiment of the system include, but is not limited to, paying bills, identification and authentication of the item or person based on RFID tag data, and authentication of assets wherein a counterfeit would lack the proper RFID tag data. The units 100 or RFID tags can be used as a point-of-sale device by which customers can order and/or pay for items or services.

One example of an RFID reader suitable for use with the system is an Active Reader Passive Tag (ARPT), which may transmit interrogator signals and receive authentication replies from passive RFID tags. Alternatively, a Passive Reader Active Tag (PRAT) may be used in correlation with active RFID tags.

In accordance with an embodiment of the invention, the tags and readers are compatible regardless of the country of origin or location, such that when a carrier of a tag travels from one country to another, the tag may be read and its data accessed by a reader in the country of destination.

Biometrics

An embodiment of the system includes badge devices having biometric data. For example, the system may include reading devices such as retina or fingerprint scanners, or any other device for obtaining biometric data. The person/animal's (the "carrier") badge device preferably has the carrier's biometric data comprised of one or more types of biometric information stored therein. The biometric data may also include multiple images of the iris, multiple scans of the same or different fingers, one or more recordings of the carrier's voice, etc.), in accordance with multimodal biometric systems to enhance correct analysis. After the reading device obtains biometric data from the person/animal being scanned, the system compares the obtained biometric data to the carrier's biometric data read from the badge device. If the biometric data do not match, an alert may be sent and the person/animal may be denied access to an area or whatever protocol is in place is preferably executed.

Sensors and Alerts

The units 100 may include one or more sensors to detect certain situations, after which the system may provide an alert to the user, service provider, etc. or execute the predetermined protocol. Non-limiting examples of such situations include (1) water leak and flooding, by detecting water on a unit 100 or on a detector laying on the floor or other desired location; (2) poor air quality by counting particle content of the air or by gathering and/or analyzing information about concentrates such as nitrogen and carbon; (3) excessive carbon monoxide by detecting carbon monoxide content; (4) presence of hazardous chemicals or bombs by detecting odors or scents and triangulating the location of its source based on the readings of multiple units 100 or devices in the system; and (5) transfer of pathogens, bacteria or other contaminants by detecting odors or scents.

Odors or scents may be detected by using an electronic nose preferably using mass spectrometry or gas chromatography. Non-limiting examples of electronic noses include metal-oxide-semiconductor devices, conducting polymers, and polymer composites.

The system in accordance with an embodiment of the invention may also detect leaks by measuring pressure or flow in pipelines, using acoustic pressure wave method, and/or balancing methods, which include statistical methods to analyze pressure/flow at a point or imbalance, Real-Time Transient Model (RTTM), Extended RTTM (E-RTTM), and bubble emission method.

A unit 100 may also include a variety of sensors, such as electromagnetic sensors and proximity sensors, including capacitive photoelectric sensors and inductive proximity sensors. Proximity sensors preferably detect the presence and location of objects within range, and may facilitate documenting and managing changes to the physical layer connectivity and assets of a building, area or structure.

A unit 100 may include a light sensor suitable for use as an optical detector to detect smoke. One example of an optical detector includes a light source (incandescent bulb or infrared LED ((Light-Emitting DiodeC)), a lens to collimate the light into a beam, and a photodiode or other photoelectric sensor at an angle to the beam as a light detector. In the absence of smoke, the light passes in front of the detector in a straight line. When smoke enters the optical chamber across the path of the light beam, some light is scattered by the smoke particles, directing it at the sensor and thus triggering the alarm. When the beam becomes less visible to the "eye" of the sensor, the optical detector sends an alarm signal, for example, to the fire alarm control panel of the unit 100 or to another device in the system.

As one of ordinary skill in the art would understand, other detectors and/or detection methods may be used without deviating from the scope of the invention. For example, an ionization smoke detector may be used, which are typically more sensitive to the flaming stage of fires than optical detectors. Another detector may be air-sampling smoke detectors, which detect microscopic particles of smoke. Examples of air-sampling smoke detectors include, but are not limited to, aspirating smoke detectors which actively draw air through a network of pipes above or below a ceiling. The air-sampling smoke detectors may be used to trigger automatic responses, such as activate a gaseous fire suppression system, sprinklers, etc.

The system in accordance with an embodiment of the invention may also include one or more flame detectors, preferably incorporated with one or more units 100. Non-limiting examples of such flame detectors include optical sensors to detect flames, ionization flame detectors which may use current flow in the flame to detect the presence of flames, and thermocouple flame detectors. Any single or combination of optical sensors may be used alone or with other sensors/detectors. Examples of optical sensors include ultraviolet (UV) detectors, near infrared (IR) array flame detectors, IR flame detectors, UV/IR flame detectors, Dual IR (IR/IR) flame detectors, and Triple IR (IR3) flame detectors.

The system in accordance with an embodiment of the invention may provide emergency light in certain situations. For example, a unit 100 may include a light that illuminates when the unit 100 goes into alarm, if an emergency situation is detected, or when a predetermined condition is met. In accordance with one embodiment, a plurality of units 100 and/or other devices in the system light up, illuminating a path to the emergency exit, along a hallway or staircase, etc. The lights may be consistently on during the situation, or strobe in sync or in sequence to indicate the direction of the exit.

Additionally, the system may provide alert mechanisms, for example, in emergency situations. The units 100 or other devices in the system may include alarms that sound in emergency or predetermined conditions. Preferably, if one or more units 100 detect an emergency or predetermined condition, alarms will sound on other units 100 in the system, according to the setting and condition. For example, the user may set it such that all the units 100 in the building will sound. Alternatively, only the units 100 on the same floor or wing as the condition-detecting unit may sound, or the floor and the floor above it, for example, if the condition-detecting unit 100 detected smoke.

The system may include other detectors and/or sensors in one or more units 100 or other devices in the system. Such detectors and sensors include, but is not limited to, nondispersive infrared (NDIR) carbon dioxide sensors, carbon monoxide detectors such as biomimetic sensors, electrochemical sensors, semiconductor sensors, detecting quartz crystal microbalance, and microelectromechanical systems (MEMS) using surface acoustic waves.

NoSQL. The system may use NoSQL, or other non-relational databases to store and retrieve data.

3D Imaging

An embodiment of the system may have a custom 3D mapping feature including at least a sensor, such as an infrared sensor, or an RFID reader/tag. The feature may allow buildings, rooms, floors, structures, spaces, etc., and its contents to be scanned to create mapping of its interior.

Various areas or zones within the buildings, rooms, floors, structures, spaces, etc. may be separately scanned and stored to provide access to one or more groups of users, each having a different level of access. Depending on the security and/or other restrictions, users may have full or varying degrees of accessibility to the stored data. Furthermore, scanning and mapping may be provided in real time, such as during emergency situations, to provide relevant, up-to-date information as to the location of persons or objects, at the time such information is needed.

Voice Command Speech Recognition

An embodiment of the system may include a voice command feature as a way to control various systems or functions within a building structure. For example, a user may use the voice command feature to turn the lights (or alarm system, or home theater system, etc.) on and/or off. The voice command feature may also include the ability to answer questions, answers to which may be found on the local hard drive or other types of storage device, or on the inte et. The voice command feature may include a microphone to broadcast the response.

Preferably, appliances or objects within the system may be controlled using the voice command feature. Different voices are preferably differentiated and accents or dialectal influences are preferably ignored. The system may also respond to several commands at once and allow commands and/or responses be customized. The system may keep a history of recent commands, accessible vocally or through other means, such as via a touch-screen.

The voice command feature may be used with speech recognition software to generate closed captioning of conversations in real time, and also include voice recognition capabilities.

Wireless Intrusion Prevention System

The system may act as wireless intrusion prevention system (WIPS), by monitoring the radio spectrum for the presence of unauthorized access points, and may automatically take countermeasures.

Energy Harvesting

The system may include an energy harvesting component that harvests energy from its surrounding environments, which may have wireless capabilities. A unit 100 or other device in the system may include an energy sensor to sense the availability of energy and communicate with the energy harvesting component to capture such energy. The energy harvested may be stored in small, wireless devices and used to power low-energy electronics. The system may also include a capacitor to ensure adequate power storage and/or to bridge intervals when no energy can be harvested.

The system may comprise a network of sensors and relays. These may be battery-less and wireless devices and may communicate with each other using a variety of communication standards, such as WiFi, Li-Fi, GSM, Ethernet/IP, BACnet, LON, KNX, DALI, etc. The system may also have a software component that processes and interprets the energy data received. The system may also have a processing unit to process all the data received, rather than have a distributed processing model.

The system may convert all types of non-electric energy into electric energy. Energy may be harvested from solar, geothermal, thermal, wind, salinity gradients, airflow gradient, electromagnetic, optical and radio frequency, and kinetic energy. Other energy source may also include, but is not limited to, piezoelectric, pyroelectric, thermalelectric, electrostatic, magnetic induction, metamaterial, human power, biomechanical, pedal power, electroactive polymers, nanogenerators and noise.

When the system is implemented within a building, it may harvest energy from within the building and use such generated energy to power itself or other systems, appliances or devices including wearable devices, requiring the consumption of energy. For example, the system may harvest energy from running water within the pipes within the building; it may also harvest energy from equipment, for example, a treadmill, or from occupants of the building. Other examples include, but are not limited to, harvesting energy created from mechanical motion using an electrodynamic energy convertor or using a miniaturized solar module generating energy from light as the source of energy and converting same to electrical energy. The system may also combine a peltier element with a DC/DC ultra-low-voltage converter that may use heat as an energy source.

The harvested energy may be used to charge or operate a wide range of low-power devices. By way of non-limiting example, it may be used to power devices including GPS or RLTS tracking tags, wearable medical sensors, consumer electronics such as e-book readers and headsets, remote sensors for HVAC control and building automation, structural monitoring, and industrial control. Depending on the power requirements and system operation, power can be sent continuously, on a scheduled basis, or on-demand.

The system may include components to create a network of transmitters in a facility that may provide wireless power on a room-by-room basis, or for a many-to-many charging topology. Devices such as mobile phones may be included as portable power sources for a number of battery-free wireless devices. For example, a mobile phone may power a battery-less, body-worn sensor that sends data to the phone via a commonly used protocol, including, but not limited to Wi-Fi, Li-Fi, Bluetooth, or ZigBee. This data may be displayed locally on the sensor, or the mobile phone or transmitted by the phone to a monitoring service.

In one embodiment of the invention, the system harvests ambient radio waves. The embodiment includes an antenna that sense and receive RF signals, an RF-to-DC converter, a power conditioner and an output to load. The embodiment preferably maintains a high RF-to-DC conversion efficiency over a wide operating range. It preferably includes RF energy-harvesting circuits that accommodate multi-band or wideband frequency ranges, and automatic frequency tuning to further increase the power output, expand mobility options, and simplify installation.

The embodiment may use radio protocol uses 315 MHz and 902 MHz frequency bands in the US. The sub1 GHZ radio waves have twice the range of 2.4 GHz signals for the same energy budget, and better penetration within buildings. As way of reference and comparison, duplicating the energy harvesting wireless system at 2.4 GHz system requires about four times more receiver nodes to cover the same area. Therefore, RF reliability may be assured because wireless signals are just 0.7 milliseconds in duration and may be transmitted multiple times for redundancy. The range of energy harvesting wireless sensors may be about 900 ft in an open field and up to 90 ft inside buildings. In comparison to 315 MHz, the 902 MHz modules may allow for integration into very small product enclosures due to short antenna length.

Industrial Control System

An embodiment of the system preferably includes an industrial control system (ICS) that may encompass several types of control systems used in industrial production, including supervisory control and data acquisition (SCADA) systems, distributed control systems (DCS), and other smaller control system configurations such as programmable logic controllers (PLC) often found in the industrial sectors and critical infrastructures. The system may also apply network access control (NAC).

Emergency Back-Up Battery

In accordance with an embodiment of the invention, the system may include a back-up battery system. One or more back-up battery rooms may be provided to house batteries or other power sources to power the facility, building, etc. should the primary source of power be unavailable, such as in a black-out. Alternatively or in combination, units 100 may include a back-up battery for providing power to the devices connected thereto, preferably if the primary source of power becomes unavailable.

Buildable System

An embodiment of the invention includes a buildable system wherein components, devices, systems, etc. connect to the system of the invention physically, electronically or via a network to transmit or receive data. For example, one or more of the components of the units 100 (or other devices) of the system may include one or more connecting mechanisms, such as pegs or other projections or a receiving cavity via which another device can connect to the system. Alternatively, there may be a chip proximate the surface of the component with which a device can communicate by contacting it or being proximate to it. The device may attach to the unit 100 magnetically, or be fixed to the unit 100 via straps, snaps, clips, adhesive, Velcro, screw, or any other mechanism suitable for retaining the device in position.

The connecting mechanisms may be located anywhere on the unit 100, be it the faceplate or front panel, which may be easiest to access, or the boards, rear panel or the electrical box. If the device is connected via a connecting mechanism to a board, rear panel or electrical box, the device is preferably hidden beneath the faceplate or front panel. However, a device may be connected via a cable or wire or somehow connected to a connecting mechanism beneath the faceplate or front panel even if the device itself is not.

Once connected, the device can communicate with the unit 100 electrically or such that data can flow between the unit 100 and the device. Therefore, a device without wireless functionality, such as the ability to connect to a WiFi network, may be able to transmit and/or receive data to/from the system and ultimately to the user. The devices themselves may have one or more connecting mechanism to which further devices can connect to the system.

The system may also include light fixtures, ceiling fans, air conditioning units, security cameras, security keypads, interface mechanisms, which connect to a unit 100 and/or communicate with a system in accordance with an embodiment of the invention.

Whereas the expandable system was described herein as having devices connect to units 100, it is to be understood that such devices may connect to any device or component of the system, including transmitters, coordinators, etc. as well as appliances or other devices in communication with the system, and is not limited to units 100.

Unmanned Crafts.

Figure 29:
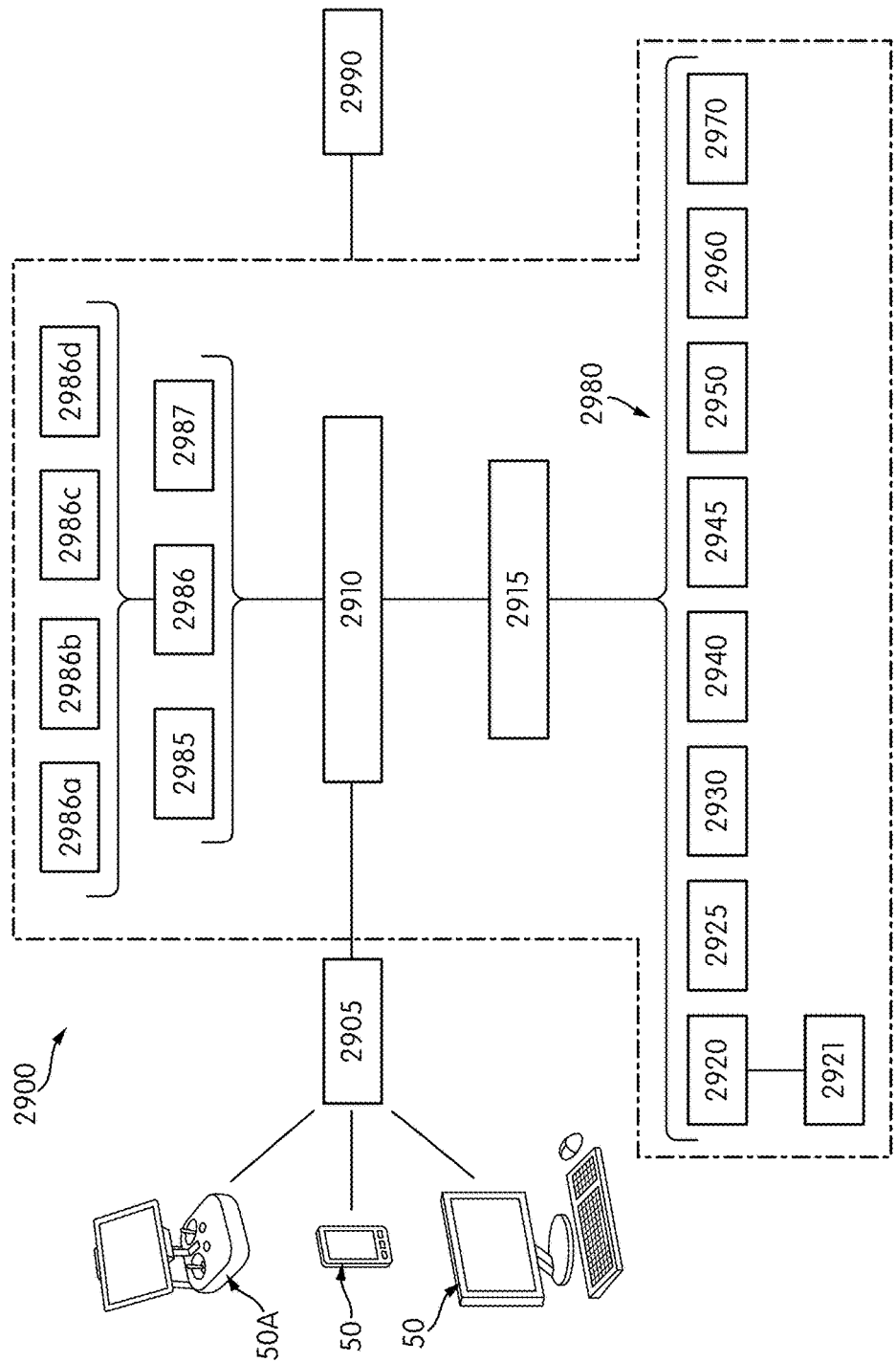
FIG. 29 is a block diagram of a miniature unmanned aircraft control system in accordance with an embodiment of the invention.

FIGS. 29-31 are directed to the integration of unmanned crafts into the networked system of Units, coordinators and servers of the present invention. The unmanned crafts can take the form of unmanned flying aircrafts, terrestrial crafts and combinations of unmanned flying and terrestrial crafts. The navigation and control systems for these crafts are depicted in FIG. 29 as system 2900. System 2900 may include a craft controller unit 2910 that may receive manual inputs from devices 2905, automatic inputs 2980 coordinated by processor 2915, various inputs coming from different mechanical components for the craft and/or various combinations of any or all of the foregoing.

Processor 2915 receives inputs from and coordinates the inputs from units 100, 200, 300, 1100, 3020 and 3070 (the "Unit(s)"), which may operate to communicate with unmanned craft 3080 and system 2900 including through processor 2915 as will be more fully set forth herein. It will be understood that processor 2915 may be separate as shown or be a part of craft controller 2910. It will be further understood that one or more processors may be utilized in the invention and that the processor 2915, craft controller 2910 may include one or more transceivers. Network system 2920 coordinates information from the entire network of Units that provide positioning coordinates throughout floors, buildings, outdoor spaces and combinations, in which they are installed and may act as flight beacons for craft 3080 as it navigates through the floors, buildings and exterior regions; see for example FIG. 31 for the array of Units throughout the floors and buildings. System 2920 also communicates with coordinators 10, routers 20 and local and remote servers 30 and 40 respectively. It will be understood from a full reading of the disclosure that craft 3080 will have many different modes of navigation, in various environments, including without having any access to the Units.

Processor 2915 also receives input from GPS system 2925, acceleration and velocity system 2930 ("Inertial System"), gyroscopic system 2940, geomagnetic and compass system 2945, camera system 2950, sensory system 2960 and attitude sensory system 2970. The attitude sensory system may measure altitude, pitch, yaw and other positional parameters regarding craft 3080 and may operate with gyroscopic system 2940 to provide information to processor 2915 and operate responsive to craft controller 2910 to stabilize and provide flight control information for craft 3080. Craft controller 2910 may transmit instructions to craft 3080 to operate and control craft propeller systems 2986, articulating arm system 2985, motor attitude system 2987 and each of them alone or in combination to navigate and fly craft 3080. While it is anticipated that systems 2990 will be located on board craft 3080, it will be understood from the overall description in this specification and as understood by one skilled in the art that other variations may be possible. It will also be understood that the systems 2990 will be located in a manner advantageous to craft 3080 including insofar as weight distribution, electrical interference and other factors.

Craft 3080 may have on board components that may include arms system 3081 which may include stationary or articulating arms (FIG. 30C) that offer resistance to air flight and may change the flight dynamics. By controlling the articulation of the arms system and arms 3081 and/or 3084, different flight dynamics may be controlled, altered and/or implemented, including control of the profile of craft 3080 further including the craft's wingspan. Further, rotor system controller 2986 controls the rotational direction and speed of craft rotors 3082 and may operate through and actuator (not shown) and rotatively couple to rotors 3082. In the illustrated embodiments, craft 3080 has four craft rotors 3082*a*, 3082*b*, 3082*c* and 3082*d*. Any number of craft rotors may be utilized as is known in the art. Rotor controller 2986 operates at the direction of craft controller 2910 to individually control each rotor 3082 in a manner to control the rotational direction and speed of each of the craft rotors 3082, together with systems 2985 and 2987 in a manner which permits craft 3080 to ascend, descend, rotate, move forward, move backward, move sidewise, diagonally and any combination of the foregoing. Likewise, the arms system may position arms 2081 and/or 2084 (FIG. 30C), which too, may offer resistance to air flight and may change the flight dynamics of craft 3080. Rotor attitude system 2987 may largely be controlled by arms articulation system 2985, however, it may include sensors that provide information regarding drag coefficients caused by the relative position of the motor housings 3090. Craft controller 2910 receives input from arms system 2985, rotor controller 2986 and motor attitude system 2987 and provides instructions and coordinates all craft system inputs to these systems to operationally control craft 3080's flight and navigation parameters and aerodynamics. Craft controller 2910 may include further include on-board processors and system controllers to effectively control and operate craft 3080 in various environmental conditions that may include temperature, wind, humidity, light, visibility and other conditions which craft 3080 may encounter. Craft controller 2910 also coordinates the navigational and flight dynamics further in view of the information and inputs communicated to it from processor 2915 and/or manual control system 2905.

Turning now to manual control system 2905, input to craft 3080 through craft controller 2910, may be made by various devices including through portable smart devices 50, which may include smart phones, tablets, iPads and the like, desk top computers and systems 50 and joy-stick styled controllers 50A. The manual control system may be used to control the flight of craft 3080 in its entirety or more preferable, used to control craft 3080 in combination with the feed-back of the automated systems of craft controller 2910. It may also be desirable to control craft 3080 entirely using only automated systems of craft controller 2910.

An embodiment of the present invention will now turn to the systems and inputs reporting to and coordinated by processor 2915.

Network system 2920 may receive sensed conditions through communications system 2921 audio, video, camera, radio frequency, motion, thermal, occupancy and other sensors from each Unit in the network for which network system 2920 receives information through com system 2921. The Units provide, for example, video, audio and RF detection and positioning information for craft 3080. This information is communicated with network system 2920 via network com system 2921 which may include various radio frequency and wireless modes of communication and may be utilized by craft 3080 as positional and navigational guidance information. It may be utilized to guide craft 3080 to a particular Unit(s) in a building or person or event detected by a Unit. Craft 3080 may fly to various locations for which there are no available Units reporting on the environmental or electrical conditions and utilize its own sensors to measure the conditions at its given location. It will be understood that craft 3080 may optionally have a selection of sensors or each and every sensor utilized and described in connection with the Units. It is also understood that such sensors may be distributed throughout the craft or be concentrated in one or several locations that may optimize their use.

GPS system 2925 in one embodiment is on-board craft 2080 and functions to provide positional and guidance information to assist in the navigation of craft 3080. It can be programed to provide flight paths for craft 3080 and can be programed to guide craft 3080 to its home base or place of origin of any given flight. It may further provide guidance to hone in on and dock at other docking stations 3030 (FIGS. 30A-C) for recharging or any other purpose dictated by the automated system or stakeholder operating or configuring the operations of the crafts. Should GPS be unavailable to craft 3080, it will operate using any one of the numerous other systems set forth herein this specification.

Acceleration and velocity system 2930 may measure velocity of craft 3080 including acceleration and deceleration, which are reported to processor 2915. In a preferred embodiment this system an accelerometer is on-board craft 3080, however, it should be understood there are many different mechanisms and systems available both on-board and remotely of craft 3080 to provide and track such information.

Gyroscopic system 2940 is in a preferred embodiment on-board craft 3080. The information is communicated to processor 2915 and used by craft controller 2910 to fly craft 3080 in a controlled and stable manner notwithstanding the various environmental conditions affecting the craft.

Geomagnetic system 2945 is in a preferred embodiment a compass but it should be understood that this system may operate in various manners utilizing various geomagnetic systems and inputs.

Visual system 2950 is an optical system that may use a camera to navigate the craft 3080 with or without resort to GPS. It can also team with other systems to navigate craft 3080. For example, it can team up with the acoustic or audio system to help guide craft 3080 when appropriate, as determined, for example, by craft controller 2910 or conditions that negatively impact visual or other signals such a smoke and the like. It may also team with networked sensors employed by the Units.

Sensory system 2960 includes a panel or circuit board and/or microchip that may include, for example, infrared detection, thermal detection, acoustic detection, laser detection, RADAR, RFID, wireless transceivers and other systems that may identify stationary or other moving objects, structures such as partitions, walls, buildings hot spots as well as the identification of mammals and human beings. Positioning and detection of all of the detected objects, structures and personnel may be communicated with processor 2915 and craft controller 2910 to be factored into navigating craft 3080 to avoid collisions, to track moving objects and follow moving objects. Other maps of structures, flight patterns and the like may be pre-programed into processor 2915. Other sensory systems that may aid in the navigation of craft 3080 may also be utilized in various combinations depending on the environment in which craft 3080 is operating.

Sensors 2970 may include all of the sensors that were described hereinbefore with respect to the Units and particularly faceplates 170, 270, 370, 1170, 3070 and in related figures throughout this specification and in FIGS. 9, 10, 17 and 30. For example, faceplates 3070 as depicted in FIG. 30 may contain methane sensors, light sensors, thermal sensors, RFID and other wireless transceiver systems, temperature sensors, motion and occupancy sensors as more full explained within this specification. Faceplate 3070 may also contain various processors that communicate with sandbox 3020, craft 3080 and the like. Craft 3080 may likewise include these sensors which it may utilize after it separates from docking system 3030. Accordingly, both craft 3080 and faceplate 2070 may contain redundant and/or duplicate sensors so that both have a full array of functioning sensors when craft 3080 separates from docking system 3030. Alternatively, craft 3080, faceplate 3070 or sandbox 3020 may contain the full array of sensors and processors. The craft, faceplate and sandbox may contain a subset of the array of sensors, which may together then make up a full array of the available sensors; or the craft, faceplate and other components of the Units may contain various subsets of the array of sensors as are necessary and/or desirable for any networked installation of Units and craft systems. It is also contemplated that craft 3080 after it separates from docking system 3030 may utilize the sensors in the network of sensors located in faceplates and sandboxes throughout the system of Units, an example of which is depicted in FIG. 31. The Units throughout the floor or building or network will detect or sense the particular conditions, thresholds or environmental and electrical conditions and may then be able to communicate the condition(s) directly to craft 3080, using the variety of communication means and protocols, wireless or otherwise, within the Units, communication system 2921 and/or may communicate the various condition or conditions to and through coordinators 10, routers 20 and servers 30 and/or 40 which may in turn communicate the conditions to craft 3080. It is likewise understood that craft 3080 may communicate various conditions to the Units, coordinators 10, routers 20 and/or servers 30 or 40 or combinations thereof. Additionally, processor 2915 may likewise operate to communicate the various conditions back to the Units through various pathways of Units, controllers, coordinators and servers as described above, through, for example, system 2920 and 2921. An embodiment also contemplates craft controller 2910 and/or processor 2915 having at least one transceiver, through which such information may be communicated and/or received.

Figures 1, 30A:
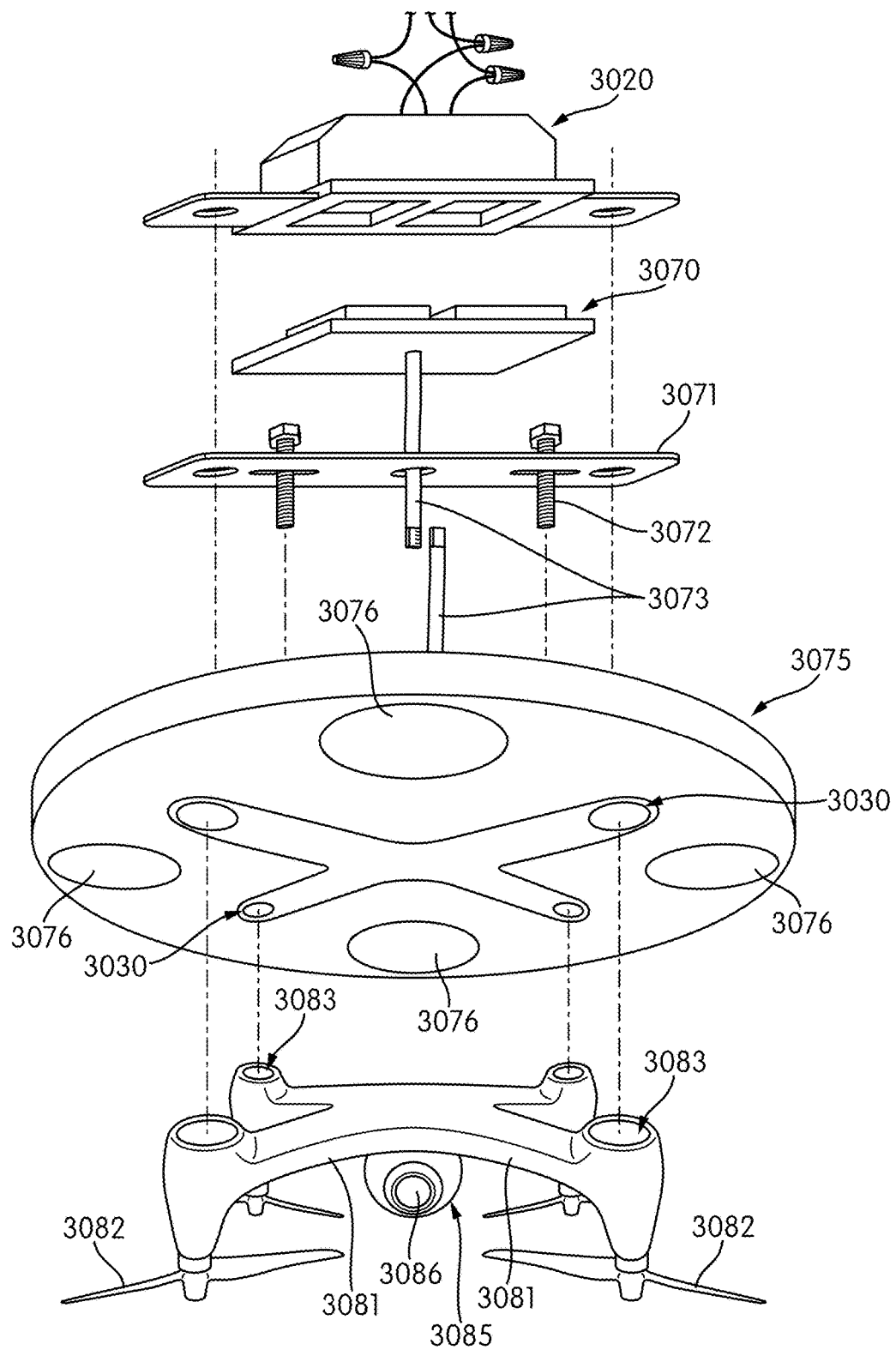
Figures 2, 30A:
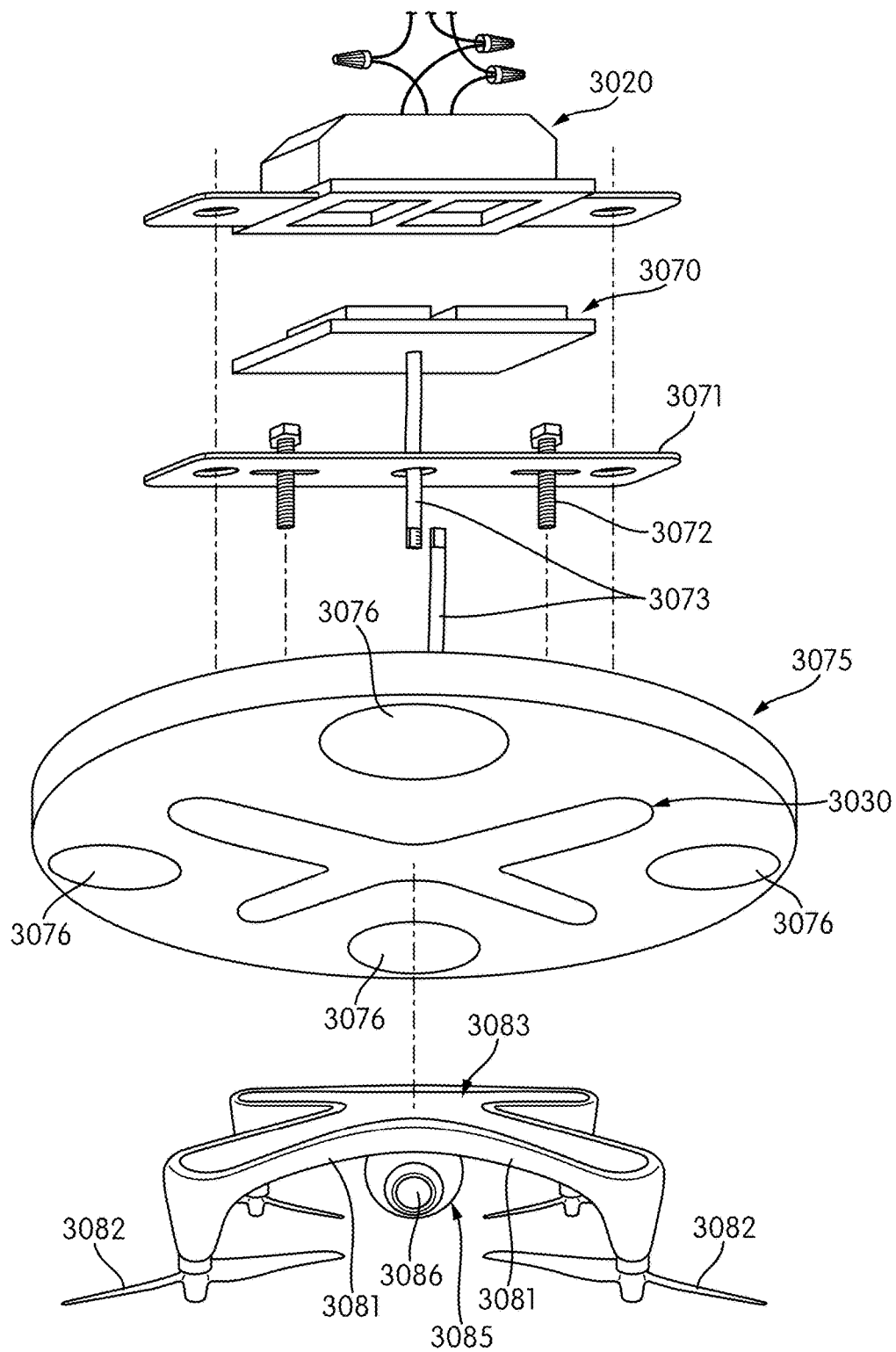

Referring to FIGS. 30A-1,2, 30B and 30C-1 through 3, these figures are directed to various docking station configurations, craft configurations and assembly of these systems for a given Unit. In FIG. 30A-1, Unit 100 in a preferred embodiment has a faceplate unit 3070 and a sandbox unit 3020 that may include the front plate 1120, boards 1102 and back plate 1110, all of which in one embodiment may make up sandbox 3020. Sandbox 3020 may be activated when it engages faceplate 3070. In another embodiment faceplate 3070 may include a securing member 3071 that is affixed to the faceplate 3070, having bolts 3072 that engage fixture 3075 that may contain LED lights 3076. Faceplate 3070 may contain the same components as sandbox 3020 or may share components to achieve desirable engineering advantages. In yet another embodiment, lights 3076 may be replaced with rotors (not shown) that are driven by motors that convert fixture 3075 into a fan. The fixture 3075 may also include both LED lights and rotors and be utilized as a light fixture and fan. The faceplate 3070 may thus include all of the foregoing components and become a faceplate light fixture, faceplate fan fixture or faceplate fan and light fixture. Electricity for the fixture 3075 and its components may be provided by virtue of connectors 3073 which are described in more detail in connection with FIGS. 26-28 in this specification. Another embodiment may incorporate the sandbox 3020 into fixture 3075 and may be powered by connectors 3073. Various combinations of sandbox, faceplate, fixture and connector combinations are contemplated as well as various mounting mechanisms, including using, for example, a rod or pole to mount with fixture 3075 that may allow the fixture to be mounted on a ceiling or wall at a given distance from the ceiling or wall.

The fixture 3075 may also be used in conjunction with craft 3080. In an embodiment, it may operate as a docking station for craft 3080. In this embodiment, fixture 3075 may include magnets that when activated engage craft 3080 and hold the craft in a locked position until the magnets are disengaged whereupon craft 3080 may be free to move away from fixture 3075. In an embodiment, the magnets are electromagnets, which may be engaged and disengaged to lock or release craft 3080. The electromagnets may be strips 3030 that are designed to mirror the shape of craft arms 3081 or a magnetic material 3083 that is affixed to or incorporated onto craft 3080; see FIG. 30A-2. Alternatively, for example, four individual electromagnets 3035 may be utilized on the fixture 3075 to engage with four corresponding areas of a magnetic material 3083 that are located on surfaces 3083 opposite of craft rotors 3082; see FIG. 30A-1. In other embodiments the number and design of the electromagnets may vary as well as the number and design of the placement of magnetic material on craft 3080 in a manner to ensure that upon engagement or disengagement of the electromagnets, craft 3080 becomes securely yet releasably affixed to fixture 3075. In yet another embodiment and while craft 3080 is securely engaged to fixture 3075, the rotors of craft 3080 may be energized and rotate causing airflow that would simulate a fan.

Figure 30B:
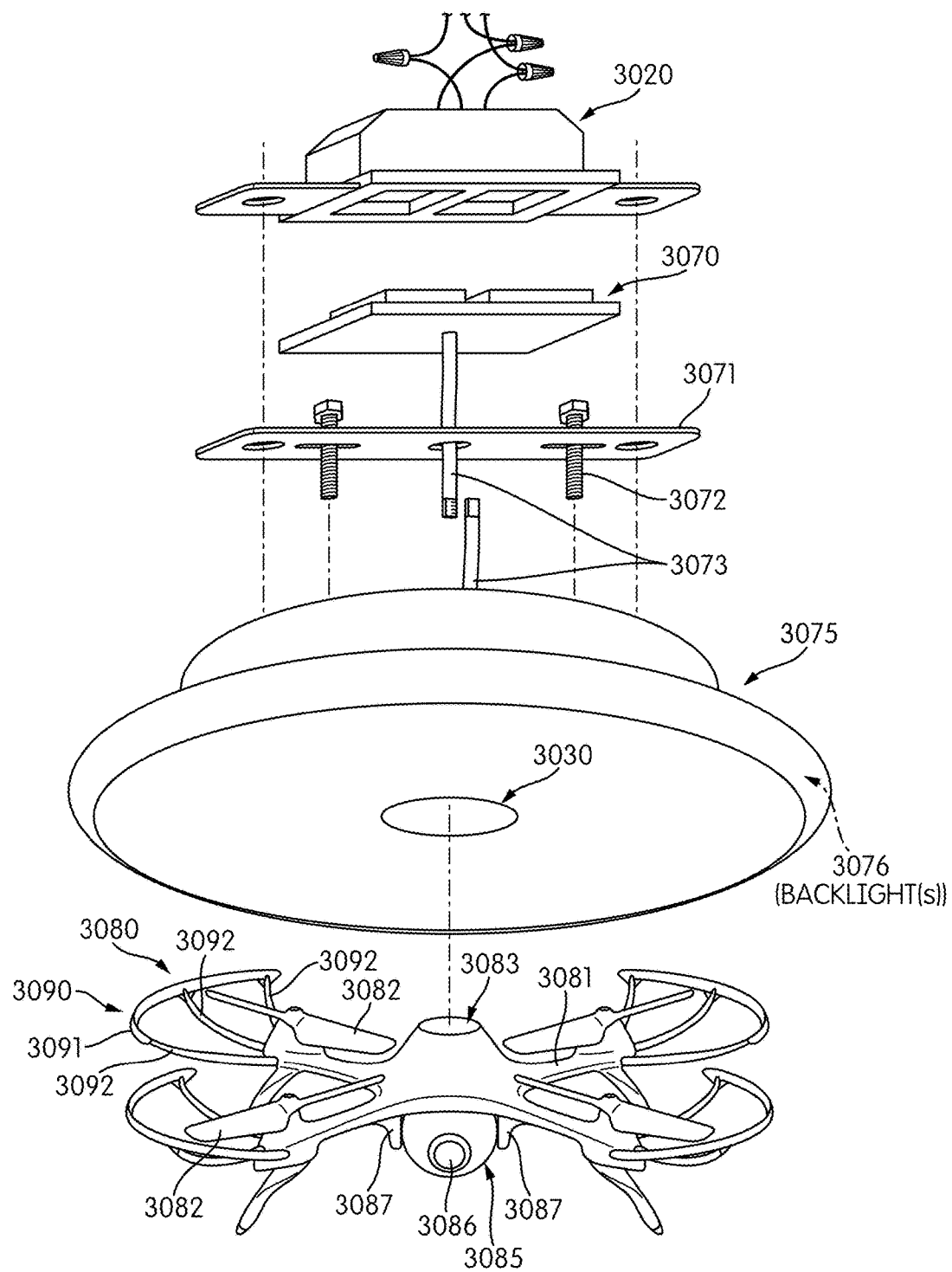
FIG. 30B is a perspective view of yet another faceplate lighting, fan docking station and drone craft in accordance with the present invention

The embodiment depicted in FIG. 30B contains most of the corresponding and like numbered components of FIGS. 30A-1 and 2, which function in the same manner as set forth in the above description with reference to FIGS. 30A-1 and 2. In this embodiment fixture 3075 contains LEDs (not shown) on the back surface 3078, which produce back lighting. The one magnet 3030 corresponds to magnetic surface 3083 on craft 3080 that provides means for securing craft 3080 to fixture 3075. The design of craft 3080 may include spoke members 3086 to provide top members 3087 which provide a shroud type of surface that prevents rotors 3082 from contacting, for example, the underside of fixture 3075 upon engagement of magnet 3030 to secure and provide docking of craft 3080 with fixture 3075 of electromagnet 3030.

In FIGS. 30A-1,2, 30B, and 30C1-3, crafts 3080 may also include mounted device 3085. The mounted device may support camera systems 2950, sensor systems 2960, or any combinations thereof including combinations of any of the systems 2980. Various systems 2980 may also be located throughout the body of craft 3080. Device 3088 may be supported by a gimbal mechanism 3085, which promotes stability of device 3086 and permits it to swivel about straps 3087 and rotate 360 degrees about rotational mount 3088 to which straps 3087 are secured. The systems that may be particularly suited for location in device 3086 may include the optical guidance system, camera systems and select systems 2990 that would be enhanced by the ability for them to be pointed in a selected direction or enhanced with their ability to be rotated and swiveled. Accordingly, these select systems may preferably be located in device 3086 whereas other systems 2980 may be best located throughout other portions of craft 3080. Another embodiment may include one where device 3086 may be another craft and where the mechanism 3085 operates to dock the second craft with the main craft 3080 where, for example, straps 3087 are electromagnets holding craft II securely until a time requiring craft II to be deployed. The embodiment where mechanism 3085 operates to carry craft II, allows craft 3080 to navigate to any desired location and if necessary deploy craft II for a separate mission wherein craft I operates to investigate one condition and craft II another condition. In this embodiment craft II may contain a different set of sensors and/or equipment than craft I (3080).

Figures 1, 30C:
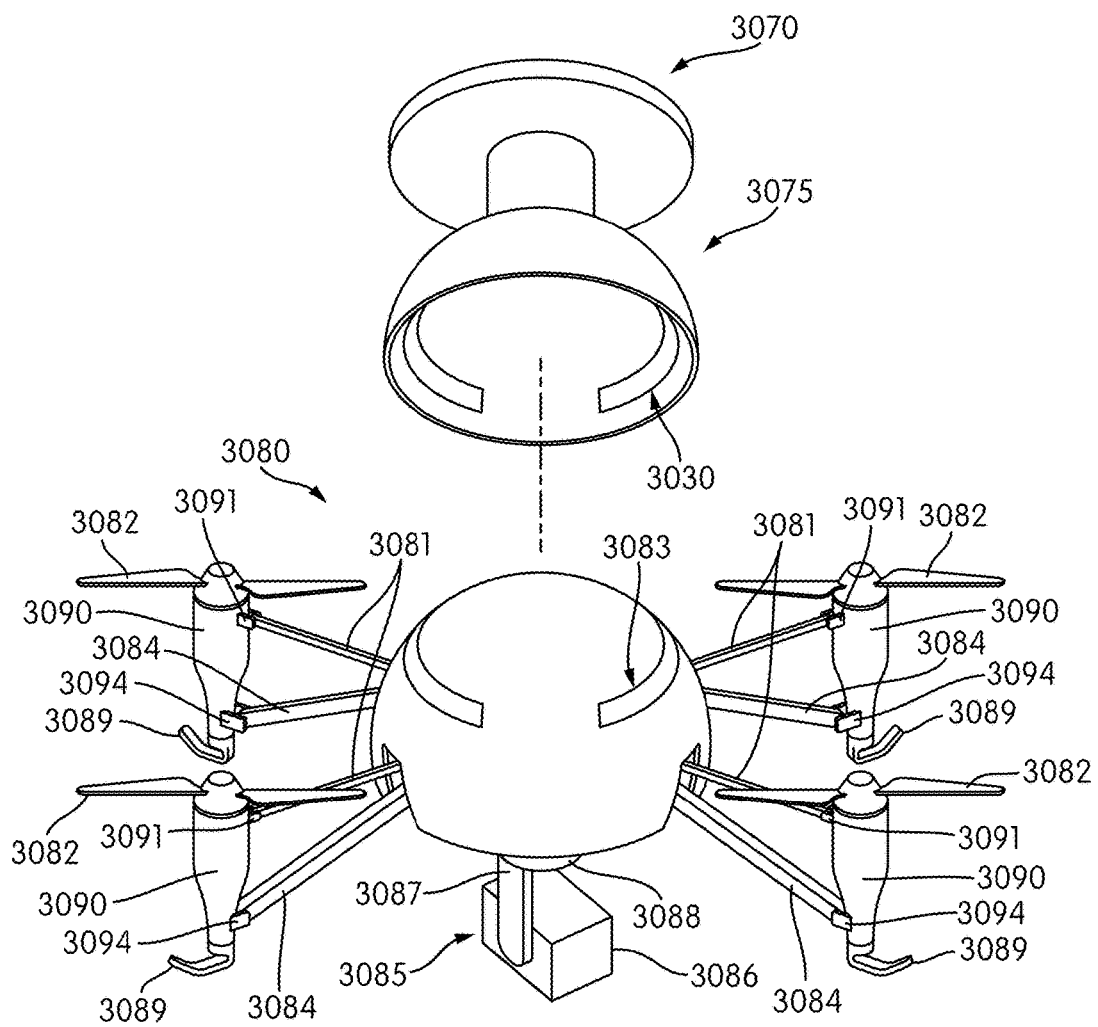
Figures 2, 30C:
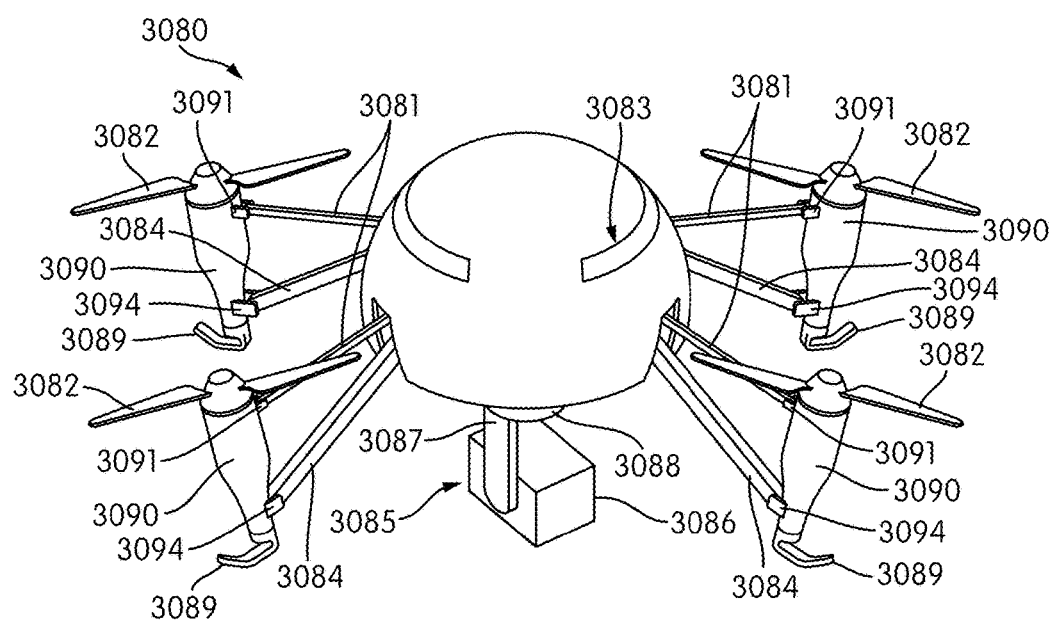
Figures 3, 30C:
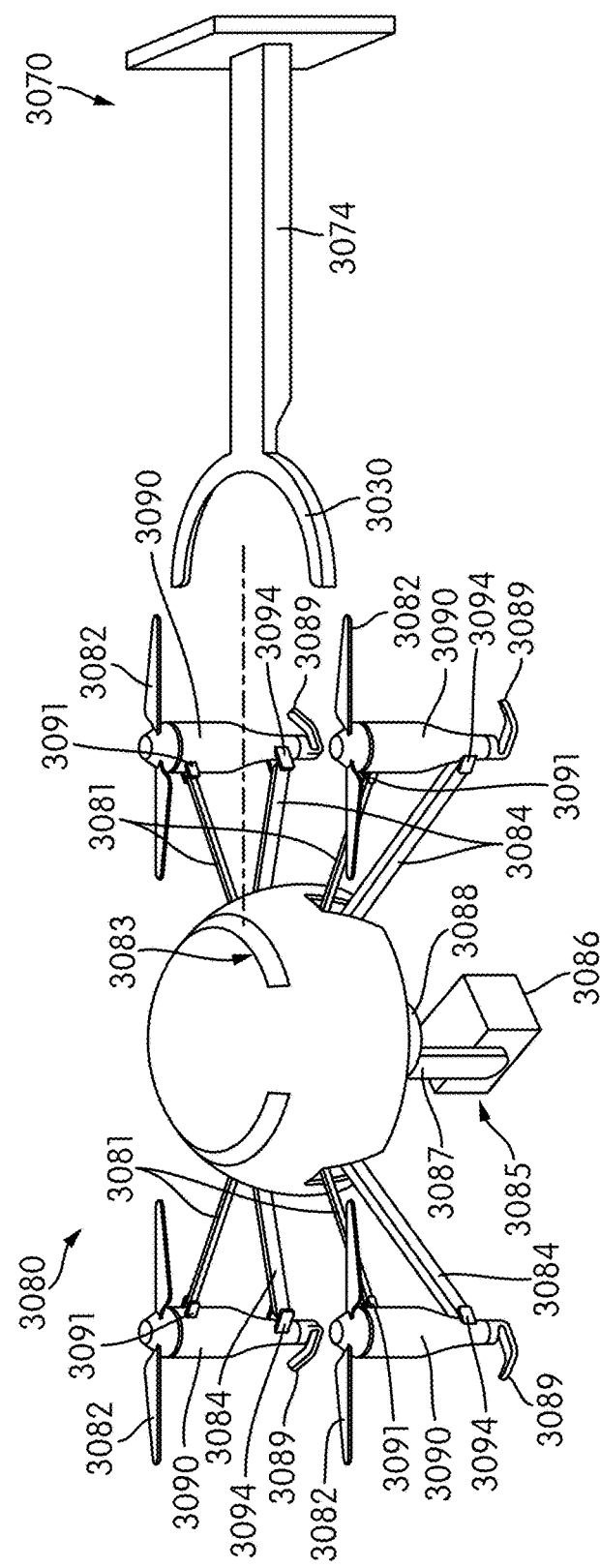

Referring now to FIG. 30C-1-3, yet another embodiment is depicted in connection with a faceplate docking system and craft design. In this embodiment, faceplate 3070 secures a dome shaped docking station 3075 that may include electro-magnets 3030. Craft 3080 also has an upper dome shaped portion that is received in docking station 3075 and craft 3080 may have magnet portions 3083 that correspond to the electro-magnets 3030 in docking station 3075. Craft 3080 has upper arms 3081 and lower arms 3084. In one embodiment the arms 3081 and 3084 both pivot up and down; FIG. 30C-1 illustrating the arms in the uppermost position and FIG. 30C-2 illustrating the arms in the lowermost position with the former being the position when the craft 3080 is in flight and the latter when craft 3080 is docked, landing or out of operation. In one embodiment arms 3081 and 3084 are passive in the sense that they are free to swivel or rotate upwardly or downwardly; here, when the rotors 3082 are rotating, and/or the craft 3080 is flying, the force of the rotors lifts the arms upwardly and ultimately can move the arms to their uppermost position. When craft 3080 is landed and/or docked, the rotors 3082 are rotating very slowly or not rotating at all and the arms drop to the lowermost position as a result of gravity. In another embodiment one or both of arms 3082 and/or 3084 are mechanically connected to a motor that causes the position of the arms to articulate between the lowermost and uppermost positions. Arms 3082 and 3084 may accordingly be varied and held in any one of many articulated positions as may be desirable to aid in the flight of craft 3080 or to control the profile of craft 3080 from fully extended arms at the uppermost position, fully refracted arms at their lowermost position or any other wingspan or profile when the arms are positioned between the uppermost and lowermost positions. It will be understood that when the arms are mechanically controlled, the arms may be controlled to keep each of the four armsets in the same relative position, keep two of the four armsets at the same but difference positions or vary each of the four armsets individually to be in different positions as may be desirable to effect different craft 3080 flight dynamics, craft 3080 positional dynamics and the like. By varying the rotational speed of the four craft rotors 3082 the craft may be made to ascend, descent, move forward, reverse, diagonally, rotate and fly in any different and/or desirable direction. With the additional option to change the articulated positions of each of crafts respective armsets, further flight options and dynamics may be effected. The automated control of the armsets may be regulated by the arms attitude system 2987 operated by craft control system 2910.

FIG. 30C-3 depicts an embodiment where the faceplate 3070 is mounted on a wall rather than the ceiling with the electro-magnets 3030 attached to an arm that extends away from the wall with the electro-magnets engaging the corresponding magnetic material on the drone 3080. Craft 3080 in this embodiment has the articulating arms 3081 and 3084, which may be positioned in their lowermost position to further ensure electro-magnetic docking element 3030 is free to engage the craft 3080 with no interference from rotors 3082. It should also be understood that the two armsets closest to the docking station 3030 may be lowered while the other two armsets remain in their uppermost position. While there are many ways to maneuver craft 3080 in position to dock craft 3080 with docking station 3030, lowing the articulation arms will cause craft 3080 to move laterally toward docking station 3030 promoting proper alignment of the electro-magnets 3030 on the docking station to properly align with the magnetic material 3083 on craft 3080. It should be understood that craft 3080 may have only one magnetic surface, two opposed magnetic surfaces as shown in FIG. 30C1-3 or a magnetic surface that completely encircles the dome shaped craft 3080. It should also be understood that the docking stations may be variously positioned against ceilings, walls, floors, traffic lights, lamp posts and other structures.

Each motor 3082 is propelled by an actuator or individual motor (not shown), housed in motor housing 3090 which is rotationally connected to each rotor 3082, the motor housing 3090 for which is pivotally mounted to arm 3084 by pivot member 3091. At the base of each motor housing 3090 is landing pad 3089 that is curved to allow it to provide a secure landing surface no mater what the articulation or angle of motor housing 3090, as a result of the level of articulation of arms 3081 and 2084 as is explained more fully hereinabove. The articulation and/or angle of motor housing 3090 also affects how the landing gear foot 3089 is articulated or angled, which may also be controlled by arm attitude system 2987 that is controlled by craft controller 2910 to affect the flight of craft 3080.

Figure 31A:
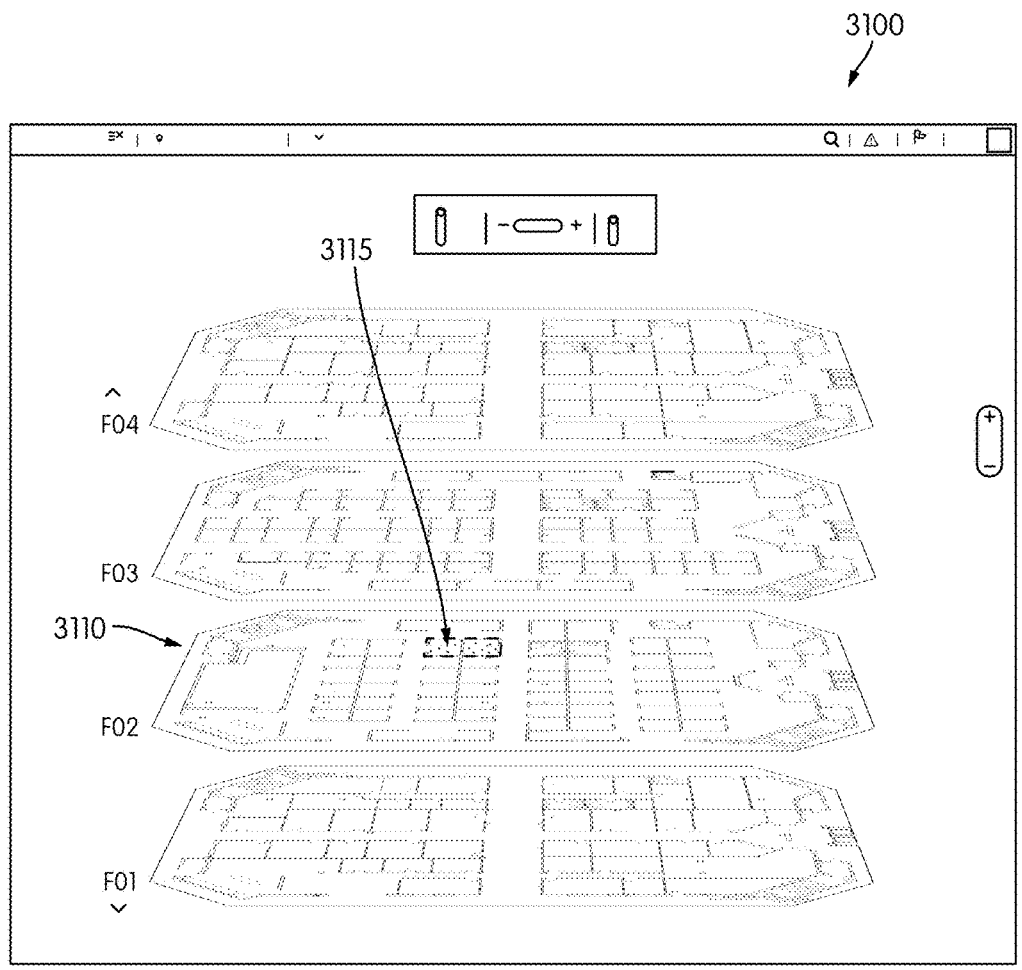
FIG. 31A is a view of a screen shot of a network system in accordance with the present invention.
Figure 31B:
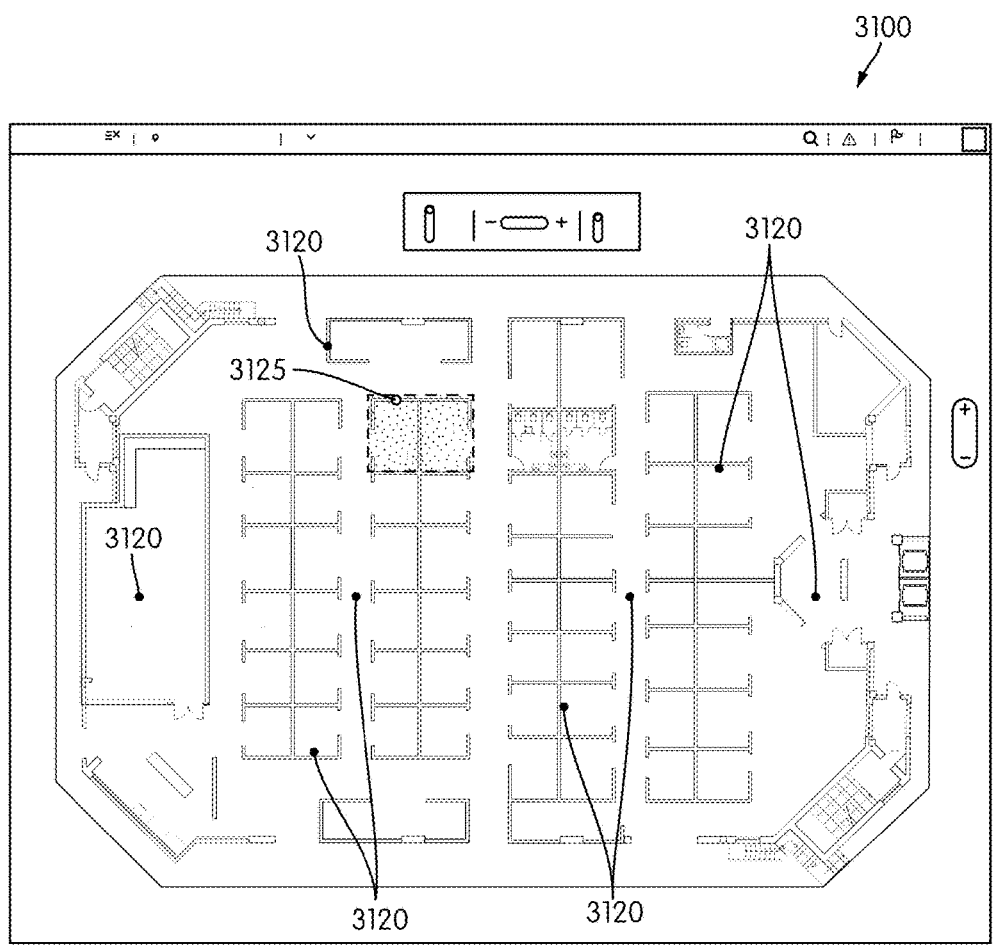
FIG. 31B is a view of another screen shot of a network system in accordance with the present invention.
Figure 31C:
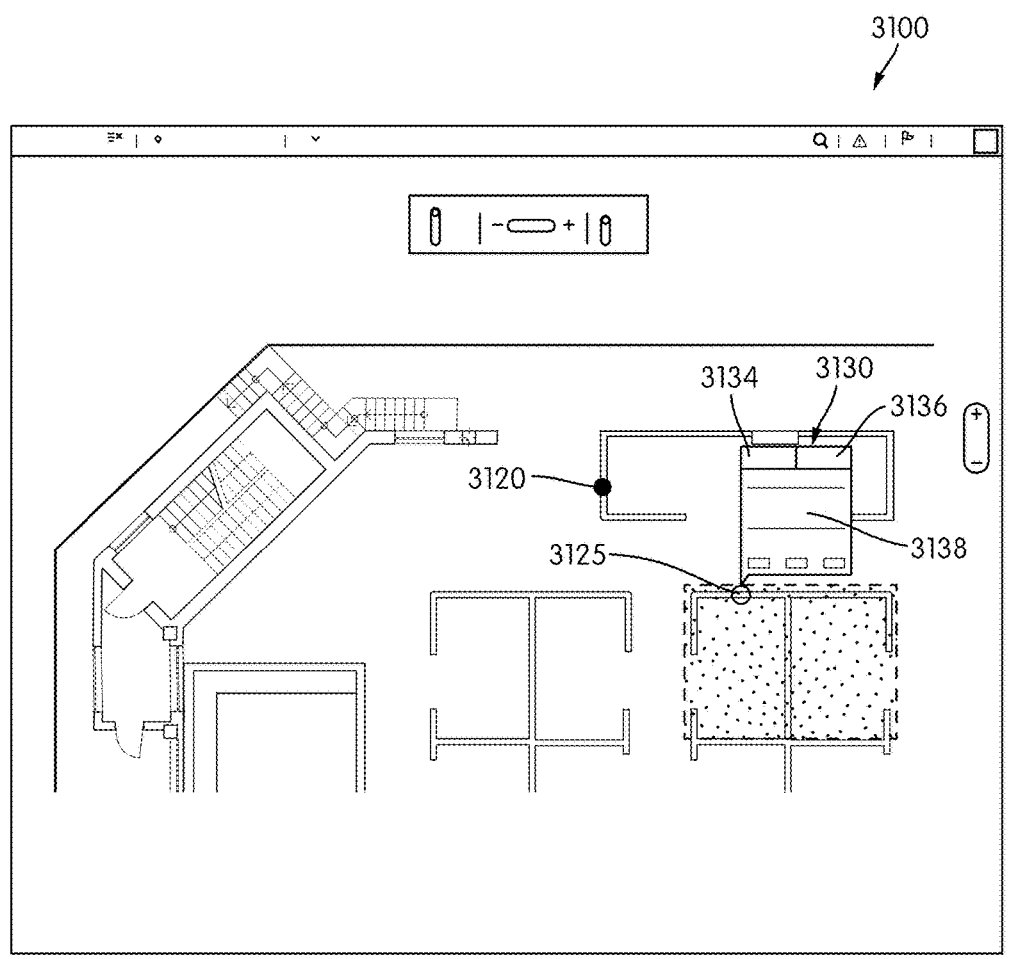
FIG. 31C is a view of yet another screen shot of a network system in accordance with the present invention.

FIGS. 31A-C depict computer screen shots of a system of sandbox units 3020 together with various faceplate units 3070 installed on four floors in a four-story building 3100 as shown in FIG. 31A. Within all of the walled-off offices and/or cubicles are multiple sandbox units 3020 with various faceplate units 3070; the Units may be outlet Units, light switch Units and/or fixture Units as set forth hereinbefore in this specification. These Units may include docking stations and crafts 3080 as are described hereinbefore. The Units are integrated into a system that communicates with the respective Units, coordinators and remote and local servers as is set forth hereinbefore. The network of Units detects various environmental and electrical conditions, controls delivery of power to such Units and appliances in communication therewith and functions to report the various conditions detected. When there is an issue that needs attention or a potential problem that is detected, the system provides alerts to users, mobile devices, desktop units and other stakeholders such as for example, building superintendents, owners, utilities, fire departments, police departments and first responders and the like. Upon receipt of any such alerts or when desirable, the stakeholders may log into the computer system through any of the described devices to check on the status of any building 3100, a particular floor 3110 of any building and any particular Unit on any floor to check the status of any conditions, including any particular alerts triggered by the networked system. On floor F02 3110 at location 3115, an alert was triggered and a stakeholder has logged into the system and accessed screen shots 3100 and particularly with respect to location 3115. In FIG. 31B only a few exemplary Units are designated; it is understood that in a typical embodiment there may be many more Units throughout each floor and each cubicle and the common areas of the buildings. Unit 3125 has detected an issue in cubicle 3115. A stakeholder using the computerize system has been alerted to the building, floor, cubicle and Unit that alerted the stakeholder to the given condition or issue. In FIG. 31C, the stakeholder has drilled down to the cubicle 3115 and the very Unit 3125 detecting and alerting the issue by clicking on the cubicle or Unit. Upon clicking on Unit 3125, a popup window 3130 appears and the stakeholder can access information on the condition of the components of Unit 3125 by clicking on faceplate button 3134 or sandbox button 3136. In text box 3138 reports on the conditions of each sensor and/or detector may be set forth and/or selected allowing the stakeholder to drill down on all of the particulars for each condition sensed. A picture of the person or persons working in cubicle 3115 may be shown as well as whether he or she is present in the cubicle.

In a further embodiment, craft 3080 may be dispatched to investigate the condition in cubicle 3115 or the person(s) in such cubicle. Craft 3080 has the capability to monitor for voices and to communicate with the Units, the person(s) in the cubicle as is set forth herein the description of this application. Craft 3080 further provides the ability to communicate live visual and audio feeds of what is transpiring in the area(s) being investigated. A stakeholder can speak with the person(s) via speakers and microphones in craft 3080 as well as in the Units. Craft 3080 may be launched from any of the docking mechanisms as described in FIG. 30. Craft 3080 may be dispatched to follow persons of interest or to investigate and/or take reconnaissance as desirable.

In yet another embodiment, the docking mechanisms for craft 3080 may be located inside various structures as well as outside structures including on street lamps, traffic lights or other outdoor structures. Craft 3080 may be dispatched to follow persons, vehicles or other objects. While it is understood that Crafts 3080 may return to its home docking station to recharge its batteries, it should also be understood that it could be equipped with solar panels, electrical generators and chargers to recharge the power system 2990 which system has components that may be located inside craft 3080, inside the docking stations, inside Units and/or combinations of the foregoing. Further, docking stations 3030 may be located variously throughout buildings, floors or outside of such buildings to provide various locations for craft 3080 to dock and/or recharge its batteries.

Additionally, other alterations can be made, as a way of non-limiting example, the number of boards and the arrangement thereof, the number of front panels and faceplate, the removal or addition of boards or panels, the size thereof, the arrangement and type of Units, including those adapted to dock with crafts 3080, may be varied, without deviating from the scope of the invention. Whereas the embodiments show boards being stacked one in front of the other, the boards may be positioned side by side, or have a panel or other component therebetween. A single board may comprise all the components of the first and second boards, and may be larger than existing electric boxes described above. For example, in new buildings without existing electrical boxes, it may be preferred for the Units to have a different size and arrangement than the embodiments that fit into currently existing electric boxes.

Another contemplated embodiment of the invention includes the use of multiple front panels simultaneously on a common board(s), providing a modular system. For example, a front panel may cover a portion of the board while leaving portions of the board exposed, so that one or more other front panels may be connected thereto. An example of such a system includes front panels having country-specific plug-receiving portions. A hotel, for instance, may want to provide outlets having multiple configurations. The unit therefore may include a front panel having one U.S. plug-receiving portion and another front panel having one European plug-receiving portion. According to where the visitor is from, the hotel may provide a front panel having the visitor's country-specific plug-receiving portion, as well as one front panel having a plug-receiving portion of the local configuration. Alternatively, a user may want a room light switch with an outlet or USB port. The user may attach a front panel having a switch interface and another front panel having a receiving portion onto the same unit. Such a modular system may provide multi-functionality to the unit and personalization, without being limited to the front panel configurations manufactured for the mass. Additionally, such a system may reduce manufacturing costs, since fewer configurations of the front panel may be necessary. It is to be understood that other combinations and configurations are contemplated without deviating from the scope of the invention. For example, the modular front panel may connect to a first front panel attached to the board(s) in a system having multiple stacking front panels as illustrated in FIGS. 7-8.

It is the intention, therefore, to be limited only as indicated by the scope of the claims appended hereto.

It is also to be understood that the following claims are intended to cover all of the generic and specific features of the invention herein described and all statements of the scope of the invention, which, as a matter of language, might be said to fall therebetween.

We claim:

1. A management system having multiple components including an unmanned vehicle comprising: an electrical fixture mounted to a wall or a ceiling of a building and including at least one electrical control unit, a sensor enabled to monitor a given condition; a power source; a processor configured to be in communication with the at least one sensor and said power source, said processor further configured to manage communications with said management system; an unmanned vehicle releasably coupled to said electrical control unit of said electrical fixture, said processor being adapted to release said unmanned vehicle to enable the unmanned vehicle to separate from said electrical control unit of said electrical fixture, wherein said sensor is enabled to monitor at least one of the following: voltage, current, real power, apparent power, reactive power, frequency, total harmonic distortion, arc fault, plug loads, power factor, GFI, AFI, light, temperature, humidity, methane, carbon monoxide, motion, thermal, occupancy, radio frequency, audio, video, infrared, and combinations thereof and wherein said unmanned vehicle can travel to various locations.

2. A management system as in claim 1, wherein there are multiple electrical control units forming a network of units, said network of units having sensors enabled to monitor at least one given condition, said sensors are enabled to monitor at least one of the following: voltage, current, real power, apparent power, reactive power, frequency, total harmonic distortion, arc fault, plug loads, power factor, GFI, AFI, light, temperature, humidity, methane, carbon monoxide, motion, thermal, occupancy, radio frequency, audio, video, infrared, and combinations thereof, wherein said unmanned vehicle travels to at least one of said electrical outlets in response to the detection of one of the conditions.

3. A management system of claim 2, wherein said multiple electrical control units further comprise positioning information and are enabled to provide said positional information to said unmanned vehicle in a manner that enables navigation for the unmanned vehicle.

4. A management system of claim 2, wherein the network of electrical control units operate to transmit data and commands between said network of electrical control units and the unmanned vehicle.

5. A management system of claim 4, wherein said energy management system is in communication with energy consuming devices, wherein the normal parameters for said energy consuming devices are programmed into at least one processor, said energy management system monitoring the conditions of said energy consuming devices, the network being enabled to detect when any one of said energy consuming devices is operating outside of said normal parameters, whereupon the detection of a condition outside the normal parameters enables at least one of the following: reporting the abnormal condition, deactivating the device with the abnormal condition, triggering an alert in response to the abnormal condition, notifying a user of the abnormal condition, dispatching the unmanned vehicle to the situs of the detected condition and any combinations thereof.

6. A management system as in claim 1, wherein the sensors are located as follows: in the electrical control unit, in the unmanned vehicle and combinations thereof.

7. A management system of claim 1, wherein said unmanned vehicle further comprises a craft navigation system that receives input from at least one sensor located on board said unmanned vehicle and controls the mechanicals of said unmanned vehicle in the movement of the vehicle.

8. A management system of claim 7, wherein the mechanicals of said unmanned vehicle include at least one of the following: a rotor control system, an arms control system, a motor attitude system and combinations of thereof.

9. A management system of claim 8, wherein said arms control system of said unmanned vehicle may be used to walk the vehicle from location to location.

10. A management system of claim 1, wherein said unmanned vehicle further comprises a craft navigation system that receives input from at least one of the following vehicle systems: network system that communicates with at least one electrical control unit, GPS system, inertial system, gyroscopic system, geomagnetic system, camera system, sensory system, attitude sensory system and combinations thereof.

11. A management system of claim 10, wherein said craft navigation system further receives inputs from at least one sensor on board said unmanned vehicle and controls the mechanicals of said unmanned vehicle that include at least one of the following: a rotor control system, an arms control system, a motor attitude system and combinations thereof, wherein the craft navigation system is enable automatically navigates said unmanned vehicle selectively utilizing the input from the sensors, mechanicals, systems and combinations thereof.

12. A management system of claim 10, further comprising manual vehicle controllers that are enable to manually maneuver the unmanned vehicle, wherein the vehicle is enabled to be maneuvered by at least one of the following: the manual vehicle controllers, the craft navigation system and combinations thereof.

13. A management system of claim 1, further comprising manual vehicle controllers that are enabled to manually maneuver the unmanned vehicle.

14. A management system of claim 1, wherein said electrical control unit further includes a docking system that is enabled to securely connect and disconnect the unmanned vehicle with the electrical control unit.

15. A management system of claim 14, wherein said docking system further includes an electromagnet unit and a magnetic material whereby upon energizing the electromagnetic unit the electromagnetic unit engages with the magnetic material and secures the unmanned vehicle with the electrical control unit.

16. A management system of claim 14, wherein the electromagnet unit is a component of the electrical control unit and the magnetic material is a component of said unmanned vehicle.

17. A management system of claim 1, wherein the electromagnetic unit is a component of the unmanned vehicle and the magnetic material is a component of the electrical control unit.

18. A management system of claim 1, wherein the unmanned vehicle is an aerial vehicle and further comprises, at least one rotor and a mechanism for engaging a payload that is transported by the unmanned vehicle.

19. A management system of claim 18, wherein the payload may include at least one of the following: a camera system, sensors, vehicle systems, another unmanned vehicle and combinations thereof.

20. A management system of claim 1, wherein the electrical control system includes at least one of the following: light fixture, fan fixture, docking station and combinations thereof.

* * * * *